US011373728B1

(12) United States Patent
Wilkerson et al.

(10) Patent No.: US 11,373,728 B1
(45) Date of Patent: *Jun. 28, 2022

(54) METHOD FOR IMPROVING MEMORY BANDWIDTH THROUGH READ AND RESTORE DECOUPLING

(71) Applicant: Kepler Computing Inc., San Francisco, CA (US)

(72) Inventors: Christopher B. Wilkerson, Portland, OR (US); Rajeev Kumar Dokania, Beaverton, OR (US); Sasikanth Manipatruni, Portland, OR (US); Amrita Mathuriya, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/351,066

(22) Filed: Jun. 17, 2021

Related U.S. Application Data

(63) Continuation of application No. 17/351,047, filed on Jun. 17, 2021.

(51) Int. Cl.
| | |
|---|---|
| *G11C 7/10* | (2006.01) |
| *G11C 8/06* | (2006.01) |
| *G11C 29/44* | (2006.01) |
| *G11C 29/18* | (2006.01) |
| *G11C 11/4091* | (2006.01) |
| *G11C 11/4093* | (2006.01) |

(52) U.S. Cl.
CPC ........ *G11C 29/4401* (2013.01); *G11C 7/1051* (2013.01); *G11C 7/1057* (2013.01); *G11C 8/06* (2013.01); *G11C 11/4091* (2013.01); *G11C 11/4093* (2013.01); *G11C 29/18* (2013.01); *G11C 2029/1802* (2013.01)

(58) Field of Classification Search
CPC . G11C 29/4401; G11C 29/18; G11C 11/4091; G11C 11/4093; G11C 2029/1802; G11C 7/1051; G11C 7/1057; G11C 8/06
USPC .......................... 365/185.09, 189.05, 230.08
See application file for complete search history.

(56) References Cited

U.S. PATENT DOCUMENTS

| | | | | |
|---|---|---|---|---|
| 7,318,123 | B2 * | 1/2008 | Mekhiel ............... | G06F 12/0884 711/E12.004 |
| 8,352,685 | B2 * | 1/2013 | Bannon ............... | G06F 12/0891 711/135 |
| 10,146,691 | B2 * | 12/2018 | Hashemi ............ | G06F 12/0886 |
| 2003/0074530 | A1 * | 4/2003 | Mahalingaiah ....... | G06F 9/3844 711/215 |

OTHER PUBLICATIONS

Application and Figures for U.S. Appl. No. 17/339,854, filed Jun. 4, 2021.

(Continued)

*Primary Examiner* — Son L Mai
(74) *Attorney, Agent, or Firm* — Mughal IP P.C.

(57) ABSTRACT

Logic (apparatus and/or software) is provided that separates read and restore operations. When a read is completed, the read data is stored in a restore buffer allowing other latency critical operations such as reads to be serviced before the restore. Deferring restore operations minimizes latency and burst bandwidth for reads and minimizes the performance impact of the non-critical restore operations.

20 Claims, 15 Drawing Sheets

(56) References Cited

OTHER PUBLICATIONS

Jacob et al., "DRAM: Architectures, Interfaces, and Systems A Tutorial," ISCA 2002, University of Maryland, 146 pages.
Lee et al., "Architecting Phase Change Memory as a Scalable DRAM Alternative," ISCA 2009, Austin, Texas, 12 pages.
Non-Final Office Action notified Feb. 9, 2022 for U.S. Appl. No. 17/351,047.
Notice of Allowance dated Apr. 20, 2022 for U.S. Appl. No. 17/351,047.
Notice of Allowance dated Mar. 8, 2022 for U.S. Appl. No. 17/356,376.

* cited by examiner

US 11,373,728 B1

METHOD FOR IMPROVING MEMORY BANDWIDTH THROUGH READ AND RESTORE DECOUPLING

CLAIM OF PRIORITY

This application is a continuation of, and claims the benefit of priority to U.S. patent application Ser. No. 17/351,047, filed on Jun. 17, 2021, titled "APPARATUS FOR IMPROVING MEMORY BANDWIDTH THROUGH READ AND RESTORE DECOUPLING", and which is incorporated by reference in entirety.

BACKGROUND

Some memory architectures suffer from destructive read. In a destructive read operation, a read operation changes or disturbs the contents of the memory being accessed for reading. To mitigate such disturbance, the memory being accessed is rewritten with the same contents as the contents being read to preserve those contents in that memory. Dynamic Random-Access Memory (DRAM) suffers from destructive read. DRAM uses sense amplifiers as a temporary buffer to address this problem. Using the sense amplifiers means that the remaining pages in a memory bank that share those sense amplifiers are unavailable until the data is written back to the memory address that was accessed for reading. Current schemes for handling destructive reads do so at the cost of memory bandwidth. For example, current schemes that write data immediately following a read operation increases the read latency by, for example, 50% and effectively reduces both read and write bandwidth by, for example, 30%. Ferroelectric Random-Access Memory (Fe-RAM) is a type of non-volatile memory. However, FeRAM also suffers from destructive read.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
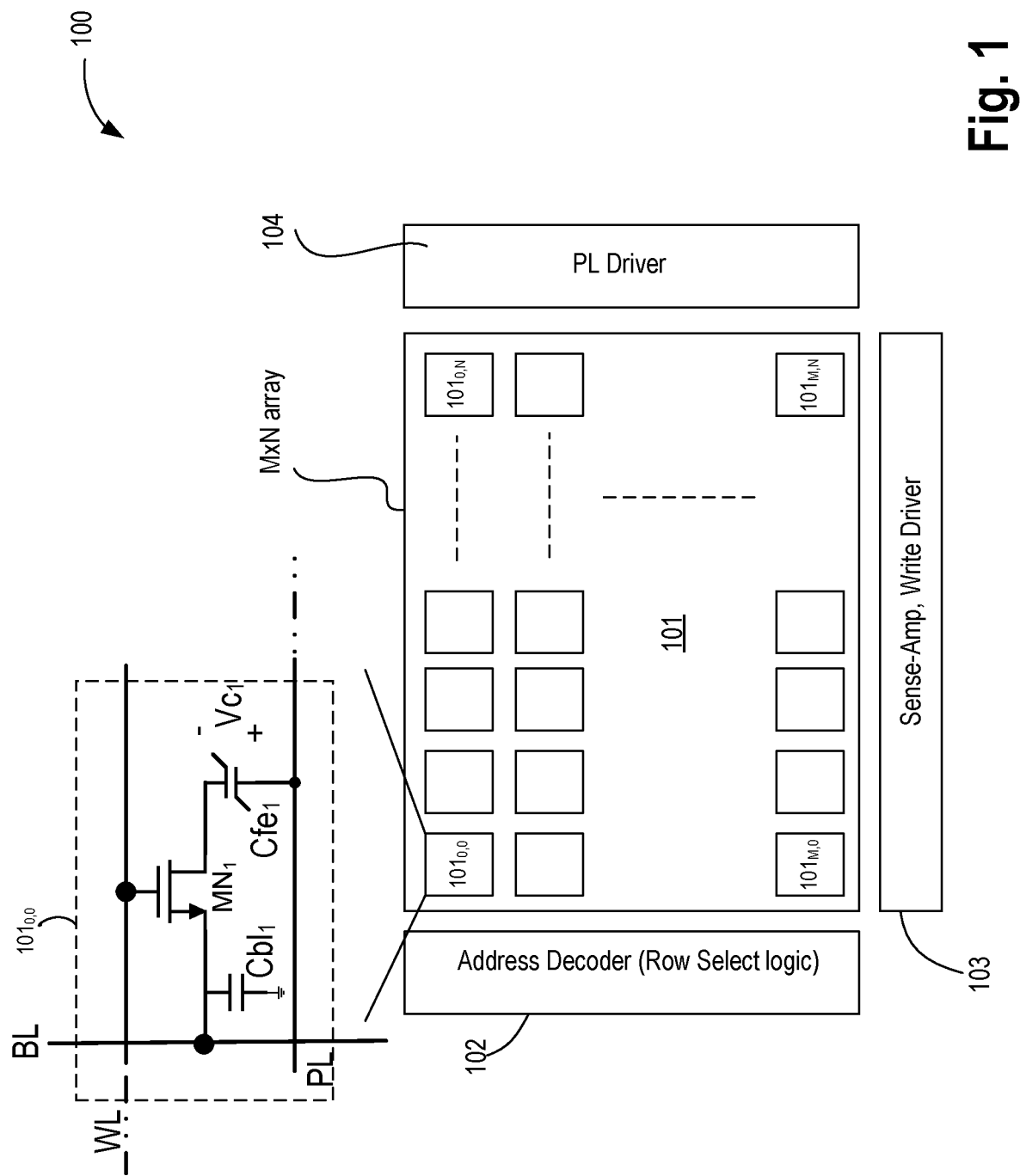
FIG. 1 illustrates an apparatus comprising memory and corresponding logic, wherein the memory comprises ferroelectric (FE) memory bit-cells, wherein the logic improves memory bandwidth through read and restore decoupling, in accordance with some embodiments.

One way to handle destructive read is to extend the read with a subsequent write. After a read operation, the data will sit on memory bit-lines for a short period of time. Memory array can then allow the contents of the bit-line(s) to be immediately written back into the bit-cell right after the read with modest overhead. In some embodiments, logic (apparatus and/or software) is described that separates read and restore operations. Here, "restore" operations are a special type of write operation that write the same data back to the memory address being accessed (e.g., read from). In some embodiments, when a read is completed, the read data is stored in a restore buffer allowing other latency critical operations such as reads to be serviced before the restore. Deferring restore operations minimizes latency and burst bandwidth for reads and minimizes the performance impact of the non-critical restores operations. Other technical effects will be evident from the various embodiments and figures.

In some embodiments an apparatus is provided which comprises a restore buffer and a circuitry (e.g., memory controller circuitry). In some embodiments, the restore buffer includes an address field and a data field. In some embodiments, the circuitry determines whether there is a memory request (e.g., a read or write request) to a memory (e.g., a FeRAM). In various embodiments, the memory is a non-SRAM memory. Upon determination that there is a memory request, the circuitry determines whether the restore buffer is full. In some embodiments, restore buffer stores a copy of data and its address, wherein the copy corresponds to data and address in the memory.

In some embodiments, the circuitry determines whether the restore buffer is empty if there is no memory request to the memory. In some embodiments, the circuitry removes an entry from the restore buffer if it is determined that the restore buffer is not empty. In some embodiments, the circuitry creates an entry in the restore buffer if the restore buffer is not full, wherein the entry is of a restore operation in waiting (e.g., a restore operation in a queue). In some embodiments, the circuitry looks up the restore buffer for an address of the memory request if the restore buffer is not full.

In some embodiments, the circuitry determines a type of memory request if the circuitry finds an address in the restore buffer that matches with the address of the memory request. In some embodiments, the circuitry reads data from the address in the restore buffer if the memory request is a read memory request. In some embodiments, the circuitry invalidates an entry in the restore buffer associated with the address that matches with the address of the memory request if the memory request is a write request, and wherein the circuitry writes data to the memory. In some embodiments, the circuitry determines a type of memory request if the circuitry finds an address in the restore buffer does not match with the address of the memory request. In some embodiments, the circuitry reads data from the memory using the address in the memory request. In some embodiments, the circuitry adds an entry in the restore buffer with data and address of the read data and the address in the memory request. In some embodiments, the restore buffer comprises static random-access memory (SRAM). In other embodiments, the restore buffer is implemented with any memory technology that does not exhibit destructive read. In some embodiments, the circuitry thereafter writes data in the memory using the address of the memory request. In some embodiments, the memory comprises one of a ferroelectric memory or a dynamic random-access memory. In some embodiments, the ferroelectric memory comprises non-linear polar material which includes one of: ferroelectric material, paraelectric material, or non-linear dielectric.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material or silicon semiconductor material layers (e.g., Indium gallium zinc oxide (IGZO), or doped IGZO) may be stacked within a single fin structure, multiple fins, nano-sheet, nanowire configuration, and/or planar transistors. The multiple non-silicon semiconductor material layers or silicon semiconductor material layers may include one or more "P-type" layers that are suitable (e.g., offer higher hole mobility than silicon) for P-type transistors. The multiple non-silicon semiconductor material layers or silicon semiconductor material layers may further include one or more "N-type" layers that are suitable (e.g., offer higher electron mobility than silicon) for N-type transistors. The multiple non-silicon semiconductor material layers or silicon semiconductor material layers may further include one or more intervening layers separating the N-type from the P-type layers. The intervening layers may be at least partially sacrificial, for example to allow one or more of a gate, a source, or a drain to wrap completely around a channel region of one or more of the N-type and P-type transistors. The multiple non-silicon semiconductor material layers or silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1 illustrates apparatus 100 comprising memory and corresponding logic, wherein the memory comprises ferroelectric (FE) memory bit-cells, wherein the logic improves memory bandwidth through read and restore decoupling, in accordance with some embodiments. Logic 102 comprises address decoders for selecting a row of bit-cells and/or a particular bit-cell from M×N array 101, where M and N are integers of same or different values. Logic 103 comprises sense-amplifiers for reading the values from the selected bit-cell, while write drivers are used to write a particular value to a selected differential bit-cell. Logic 104 includes plate-line (PL) drivers to drive the PL of the bit-cells. Here, a schematic of ferroelectric (FE) bit-cell $101_{0,0}$ is illustrated. The same embodiments apply to other bit-cells of M×N array 101. In some embodiments, each bit-cell can be a differential bit-cell. In some embodiments, each bit-cell is a DRAM bit-cell.

In some embodiments, ferroelectric bit-cell $101_{0,0}$ comprises a word-line (WL), a plate-line (PL), a bit-line (BL), an n-type transistor $MN_1$, and an FE capacitive structure $Cfe_1$. In some embodiments, the gate of transistor $MN_1$ is coupled to the WL. In some embodiments, a first terminal of the FE capacitive structure $Cfe_1$ is coupled to the PL while a second terminal of the FE capacitive structure $Cfe_1$ is coupled to source or drain terminals of the n-type transistor $MN_1$. In some embodiments, the BL is coupled to the source or drain terminal of the transistor $MN_1$. In some embodiments, a BL capacitor $Cbl_1$ (a non-ferroelectric capacitor) is coupled to the source or drain terminal of the transistor $MN_1$ and to a reference node (e.g., ground) such that FE capacitor $Cfe_1$ is not coupled to the same source or drain terminal.

Figure 12:
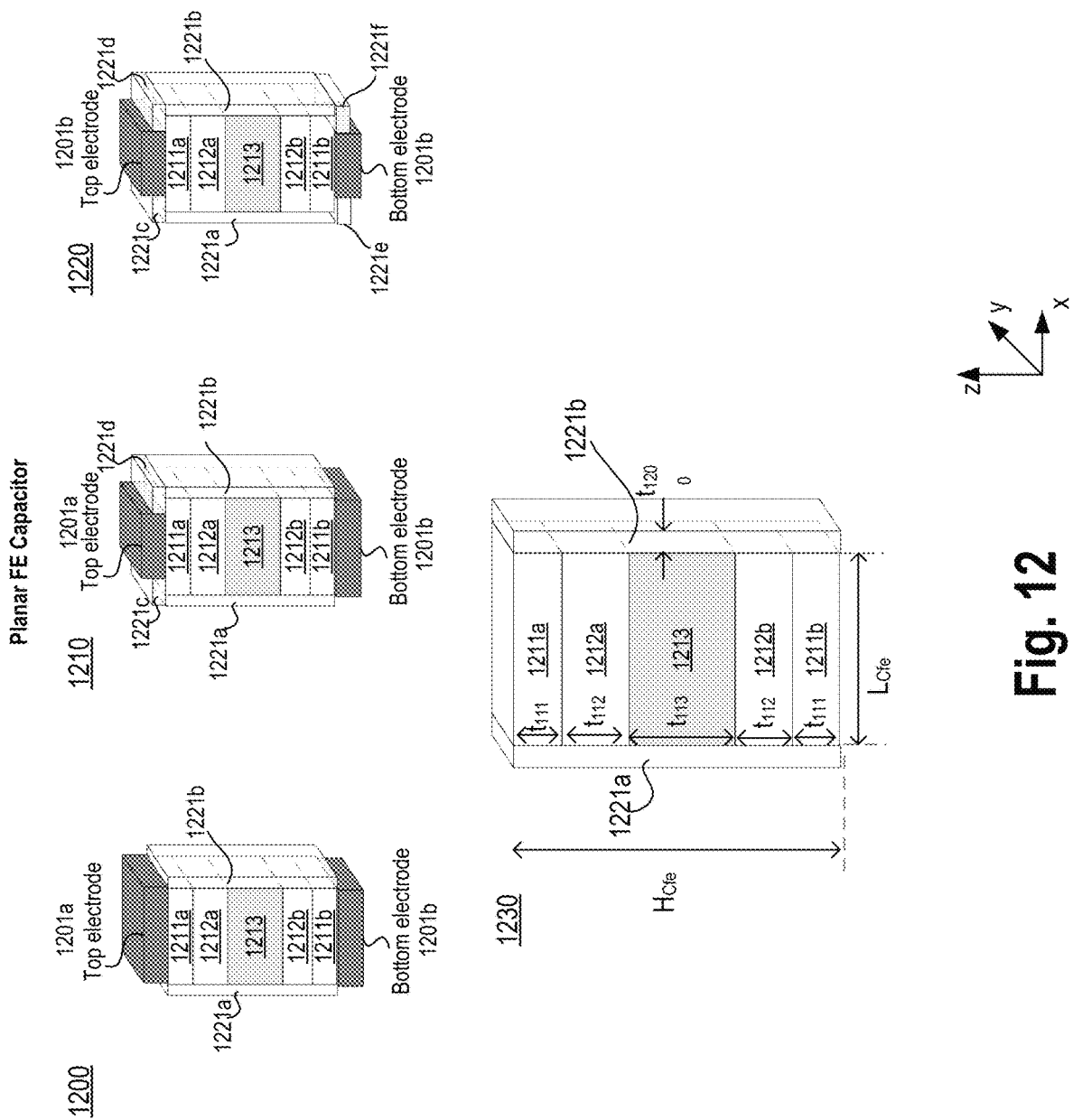
FIG. 12 illustrates various kinds of planar ferroelectric capacitors for use in the memory area, which is mitigated for destructive read, in accordance with some embodiments.
Figure 13:
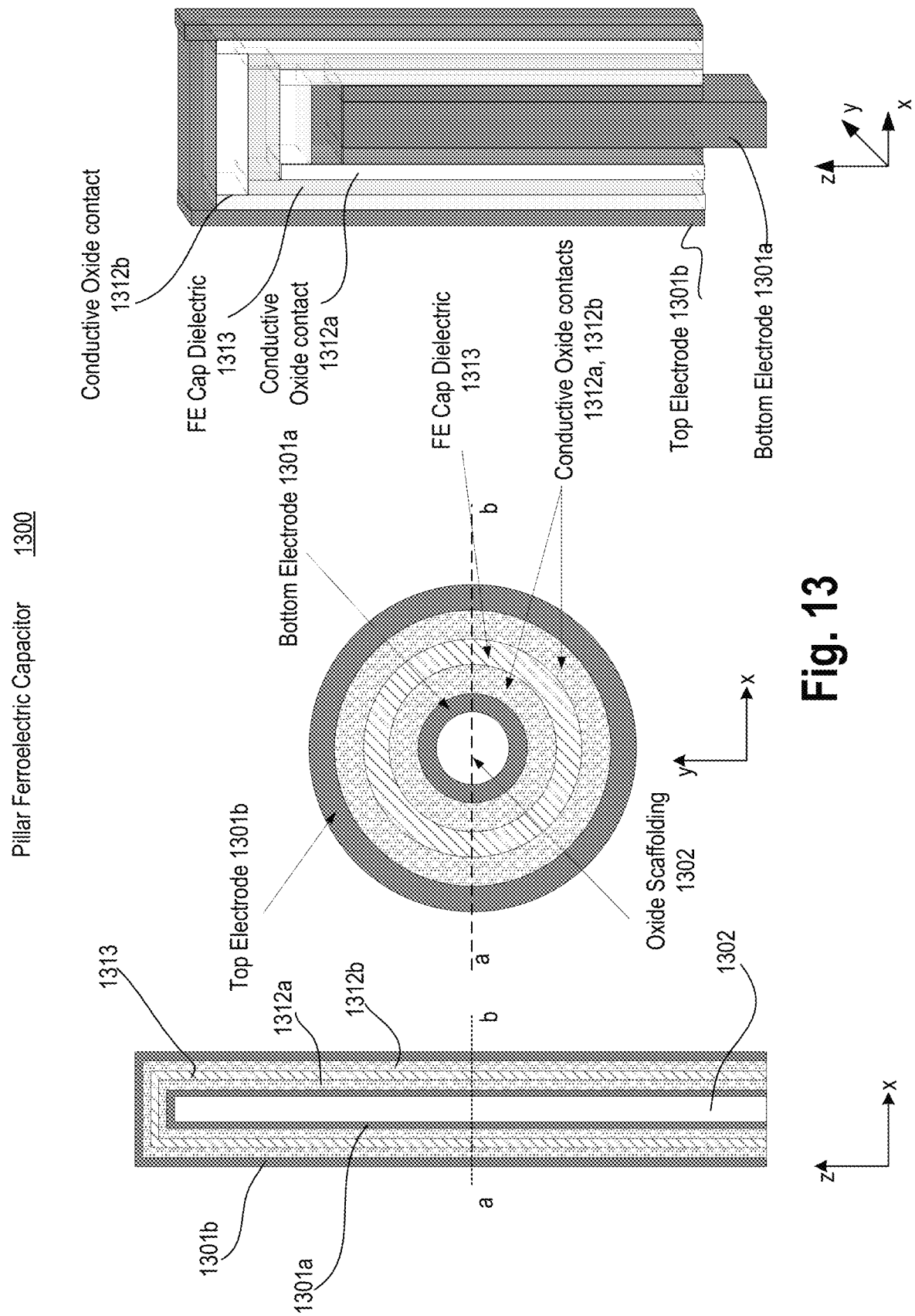
FIG. 13 illustrates a pillar ferroelectric capacitor for use in the memory area which is mitigated for destructive read, in accordance with some embodiments.

In some embodiments, the FE capacitor $Cfe_1$ comprises a stack of layers. FIGS. 12-13 illustrate various stack configurations. In some embodiments, the stack of layers includes a templating or texturing material. The templating or texturing material can be a single layer deposited below a ferroelectric layer to enable a crystal lattice of the subsequently deposited ferroelectric layer to template off this templating material and provide a large degree of preferential orientation despite the lack of epitaxial substrates. In some embodiments, the templating material is part of a bottom electrode. In some embodiments, the templating material is part of a bottom electrode and a barrier layer. The memory array area of various embodiments can comprise differential bit-cells. In some embodiments, the memory area of the embedded memory comprises DRAM, which includes bit-cells also organized in rows and columns. Each DRAM bit-cell includes an access transistor and a non-ferroelectric capacitor. While the various embodiments are illustrated for ferroelectric memory stacks, the fabrication process of various embodiments is applicable to any embedded memory. For example, the memory stack can comprise a magnetic memory stack (MRAM), a resistive memory stack (ReRAM), etc.

In some embodiments, address decoder 102, write driver 103, PL driver 104, and/or any other suitable logic includes hardware and/or software for destructive read mitigation. In some embodiments, the logic separate read and restore operations. In some embodiments, when a read is completed, the read data is stored in a "restore buffer" allowing other latency critical operations such as reads to be serviced before the restore. Deferring restore operations minimizes latency and bursts bandwidth for reads and minimizes the performance impact of the non-critical restores operations.

Figure 2:
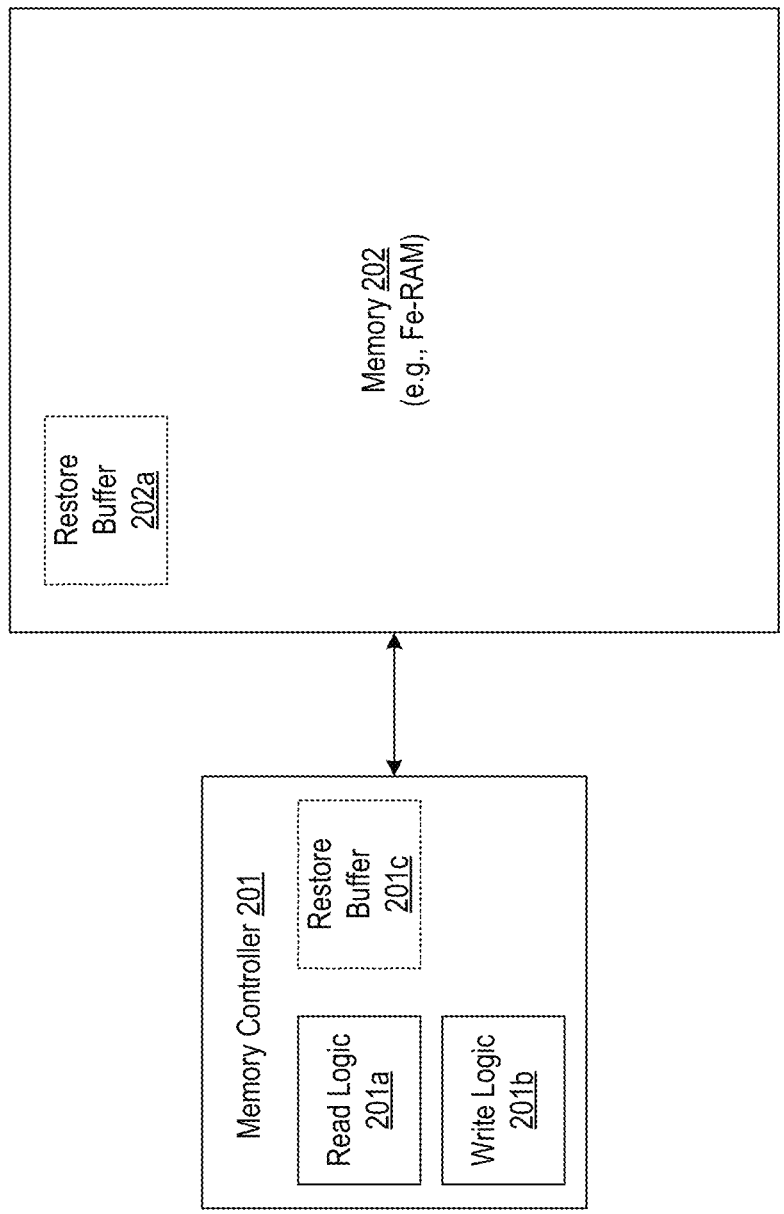
FIG. 2 illustrates a memory system having a memory controller with read and write logic to improve memory bandwidth through read and restore decoupling, in accordance with some embodiments.

FIG. 2 illustrates memory system 200 having a memory controller with read and write logic to improve memory bandwidth through read and restore decoupling, in accordance with some embodiments. Memory system 200 comprises memory controller 201 and memory 202 (e.g., memory array 101). Memory 202 is organized as memory banks, where each memory bank has a plurality of cache-lines or words. Each word has a plurality of bit-cells.

In some embodiments, memory controller 201 includes read logic 201a, write logic 201b, and restore buffer 201c. In some embodiments, memory 202 has a restore buffer 202a. So as not to obscure the various embodiments, various components of memory controller 201 are not disclosed. For example, error correction code (ECC) logic, decoders, encoders, drivers, etc. are not shown but are part of the various embodiments.

In some embodiments, read logic 201a checks restore buffer 201c first before checking memory 202 for the word to read. For example, read logic 201a compares an address with addresses of restore buffer 201c to determine if the address to read from is already present in restore buffer 201c. If the address is present in restore buffer 201c (or restore buffer 202a), read logic 201a fetches the corresponding data associated with that address. The corresponding data is also stored in restore buffer 201c (or restore buffer 202a). In this case, it may not be necessary to read memory array 202 since the requested data has already been found in restore buffer 201c (or 202a). In one such embodiment, since a memory port is available, the read data may be written into memory 202 allowing the release of the entry in restore buffer 201c and 202a. In some embodiments, if read logic 201a does not find the address in restore buffer 201c (or 202a), it will fetch the data from the address in memory 202. In this case, the read data and its address is also written to restore buffer 201c to mitigate read disturbance.

In the case of write, in some embodiments, write logic 201b writes the data to an address in memory 202 and invalidates a matching restore buffer entry in restore buffer 201c (or 202a). For example, a matching address in restore buffer 201c or 202a is erased or invalidated (by setting a bit) because the contents of that address have been updated. The write data in this case is a more recent version of the address contained in restore buffer 201c or 202a. In various embodiments, restore buffer 201c and/or restore buffer 202a are implemented with memory technologies that do not suffer from read disturbance. Examples of such memory for restore buffer 201c and 202a include static random-access memory (SRAM) and magnetic random-access memory (MRAM). In some embodiments, restore buffer 201c and 202a comprise flash memory (e.g., NAND flash memory).

Figure 3:
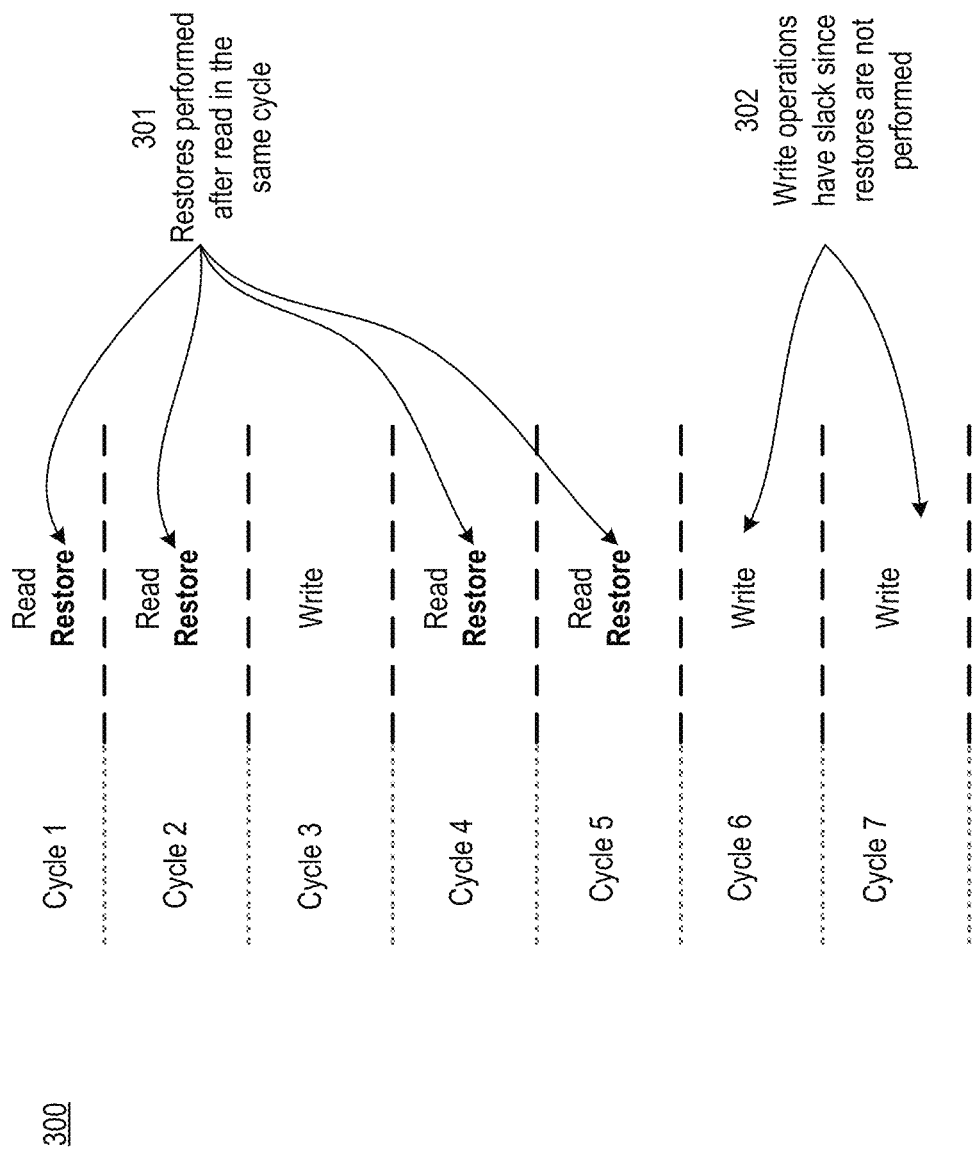
FIG. 3 illustrates a destructive read mitigation scheme that maximizes read bandwidth, in accordance with some embodiments.

FIG. 3 illustrates a destructive read mitigation scheme 300 that maximizes read bandwidth, in accordance with some embodiments. In some embodiments, within every memory access cycle (e.g., 1 nanoseconds (ns)) for read operation, a restore is performed in the same cycle as illustrated by identifier 301. The write operations, which do not present disturbance issues, have timing slack since restores are not performed.

In this example, each memory access comes with a 1 ns latency. This latency is the minimum time required to perform both the read operation and subsequent restore (write). One advantage of scheme 300 is that memory array 101 can be cleverly designed to allow the restore operation to exploit work done during the previous read operation. This means that the restore operation, taken in isolation, consumes much less power and latency than it would otherwise require. For example, in the example of scheme 300, a basic read operation can be completed in 0.7 ns, but an optimized restore could be completed in an additional 0.3 ns, where 1 ns is the total latency per access cycle. This would imply a combined latency of 1 ns for the memory that supports fused or combined read and restore operations. Write operations 302, which do not use a restore, cannot be completed in 0.7 ns but will instead take 1 ns since all operations will require at least a single 1 ns cycle to complete in this example. Scheme 300 thus maximizes read bandwidth.

Figure 4:
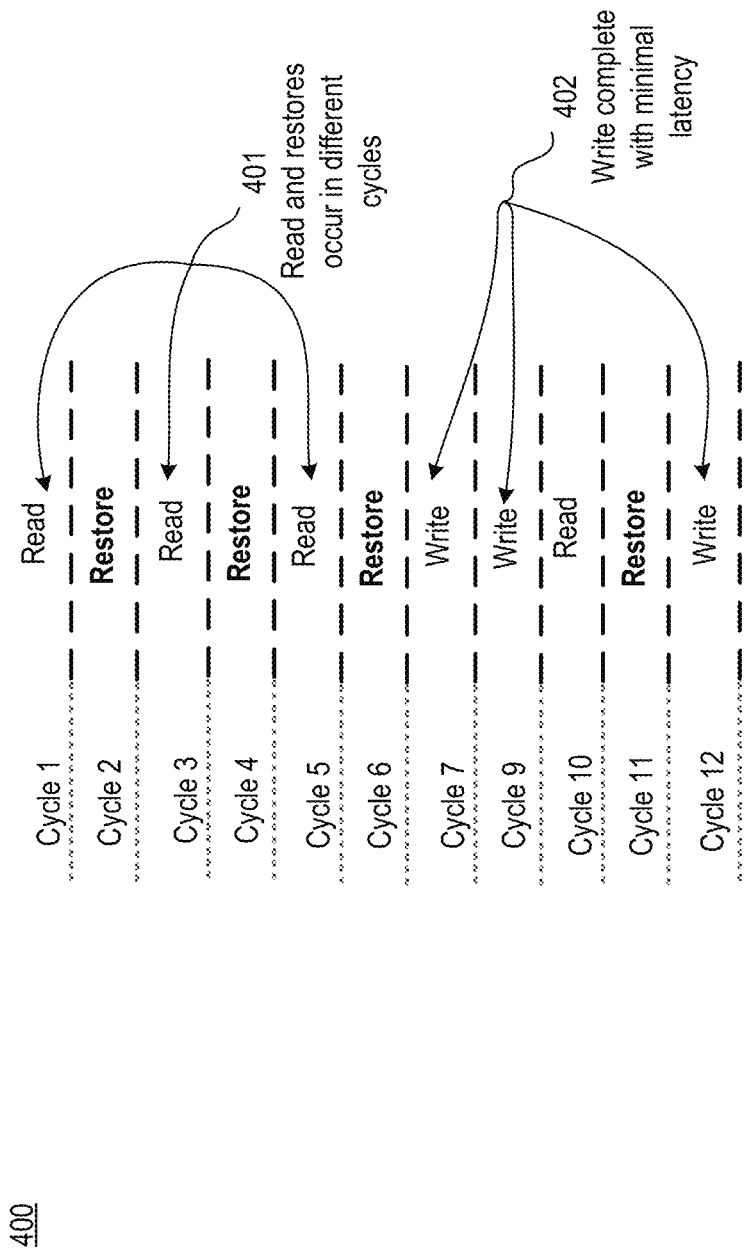
FIG. 4 illustrates a destructive read mitigation scheme that improves write bandwidth, but lowers read bandwidth, in accordance with some embodiments.

FIG. 4 illustrates destructive read mitigation scheme 400 that improves write bandwidth but lowers read bandwidth, in accordance with some embodiments. Compared to scheme 300, here read and restore operations occur in different memory access cycles as indicated by identifier 401. Consequently, write operations 402 also complete with minimal latency. Here, clock frequency of memory can be increased compared to scheme 300, enabling higher write bandwidths (e.g., 1 write every 0.7 ns vs. 1 ns) but due to the separation of the read and restore operation, read bandwidth is reduced by 30% (1/1.4).

Figure 5:
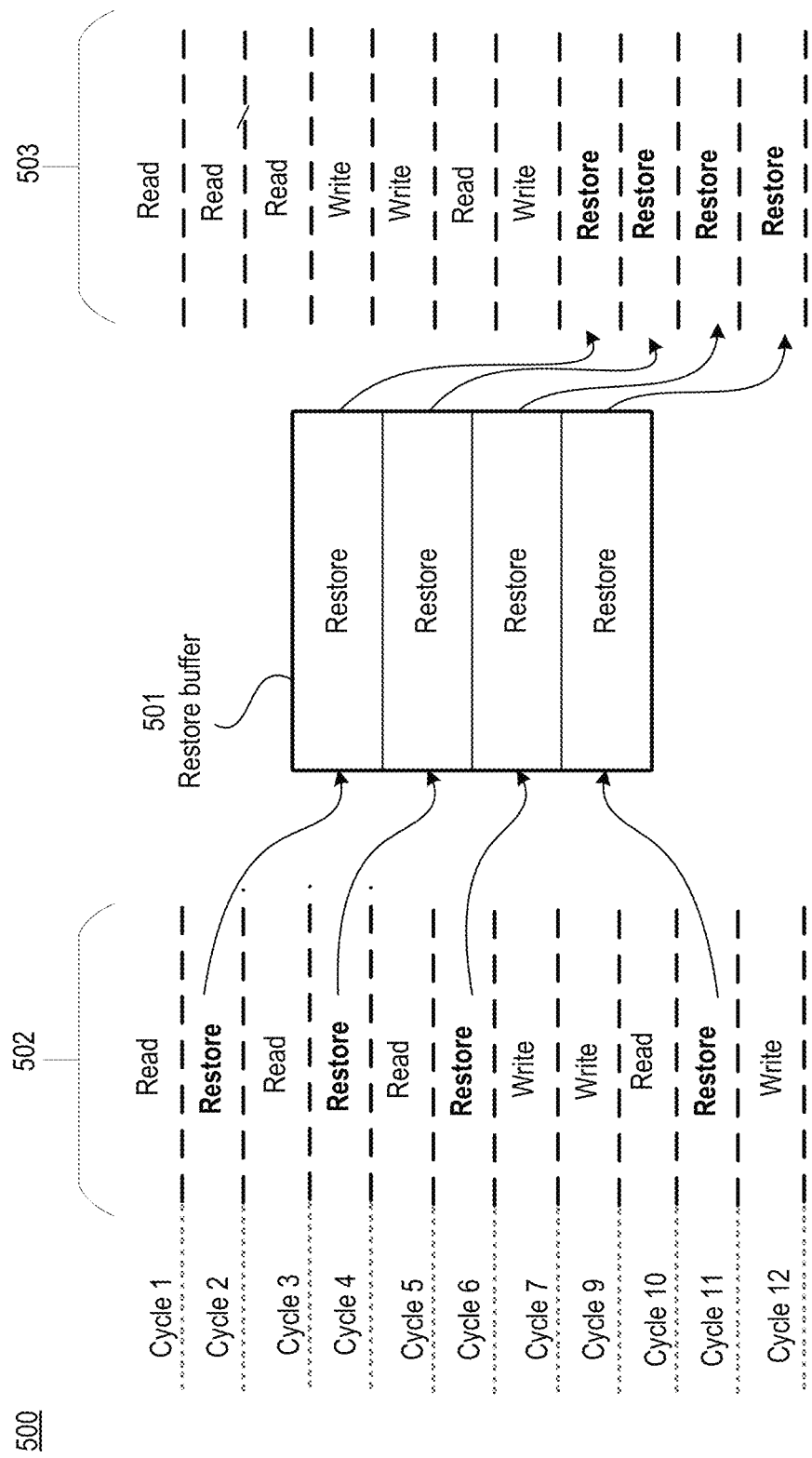
FIG. 5 illustrates a destructive read mitigation scheme using a restore buffer, in accordance with some embodiments.

FIG. 5 illustrates destructive read mitigation scheme 500 using restore buffer 501, in accordance with some embodiments. Separating read and restore provides a tradeoff since it provides higher write bandwidth at the cost of reducing read bandwidth. This tradeoff makes sense in the context of an additional micro architectural optimization, the addition of restore buffer 501. Since restores are not latency critical, they can be deferred, allowing reads (and writes potentially) to bypass them. Scheme 500 shows original reference stream 502 with reads and accompanying restore operations, where read and restore are performed in separate memory cycles. To the right in FIG. 5, scheme 500 shows reference stream 502 is reordered as stream 503 allowing reads and writes to complete earlier by buffering the restores in restore buffer 501 until after the read and writes have completed.

In some embodiments, memory controller 201 (e.g., controller logic) ensures that race conditions among various writes and restores do not occur. In some embodiments, memory controller 201 (e.g., controller logic) ensures that write-after-write (waw) or read-after-write (raw) hazards among various writes and restores do not occur. If a write to a given address location occurs while a restore to the same address has been waiting, then the restore operation to that address can be removed from a scheduler. In one such embodiment, first restore operation to that address is completed before the write operation to that address is completed.

Figure 6:
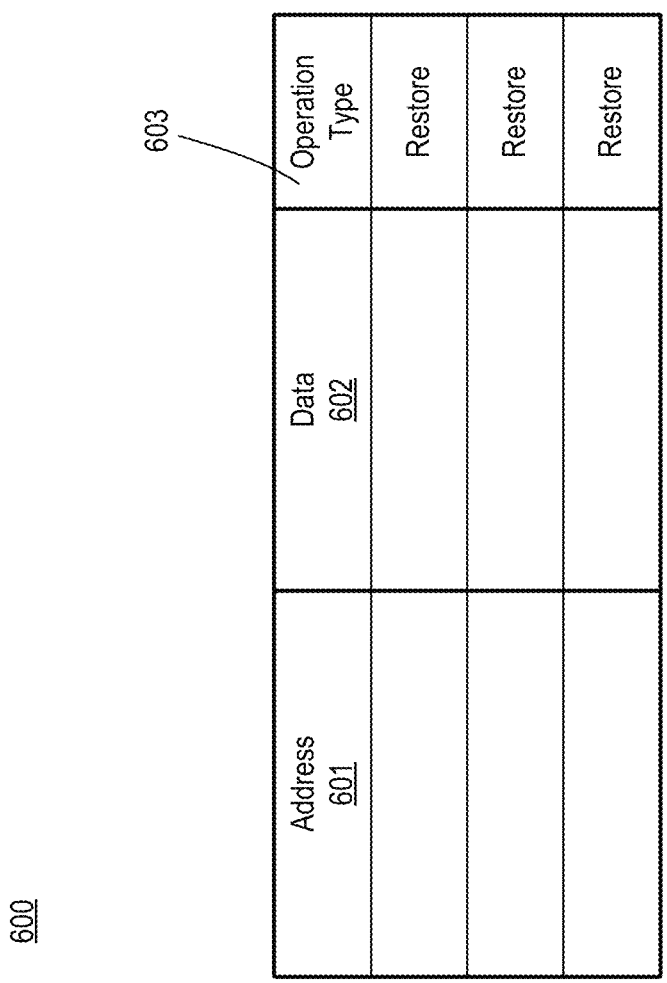
FIG. 6 illustrates a restore buffer for the destructive read mitigation scheme, in accordance with some embodiments.

FIG. 6 illustrates restore buffer 600 (e.g., buffer 201c, 202a, 501) for the destructive read mitigation scheme, in accordance with some embodiments. Restore buffer 600 includes address field 601, data field 602, and operation type (optype) 603. In some embodiments, restore buffer 600 holds both the address and the data for a memory location until the restore can be completed. In some embodiments, the operation type field 603 can be removed. The size of restore buffer 600 (e.g., the number of address or data entries) can be any suitable size. For example, the size of restore buffer 600 can be equal to a memory bank of memory 202.

Figure 7:
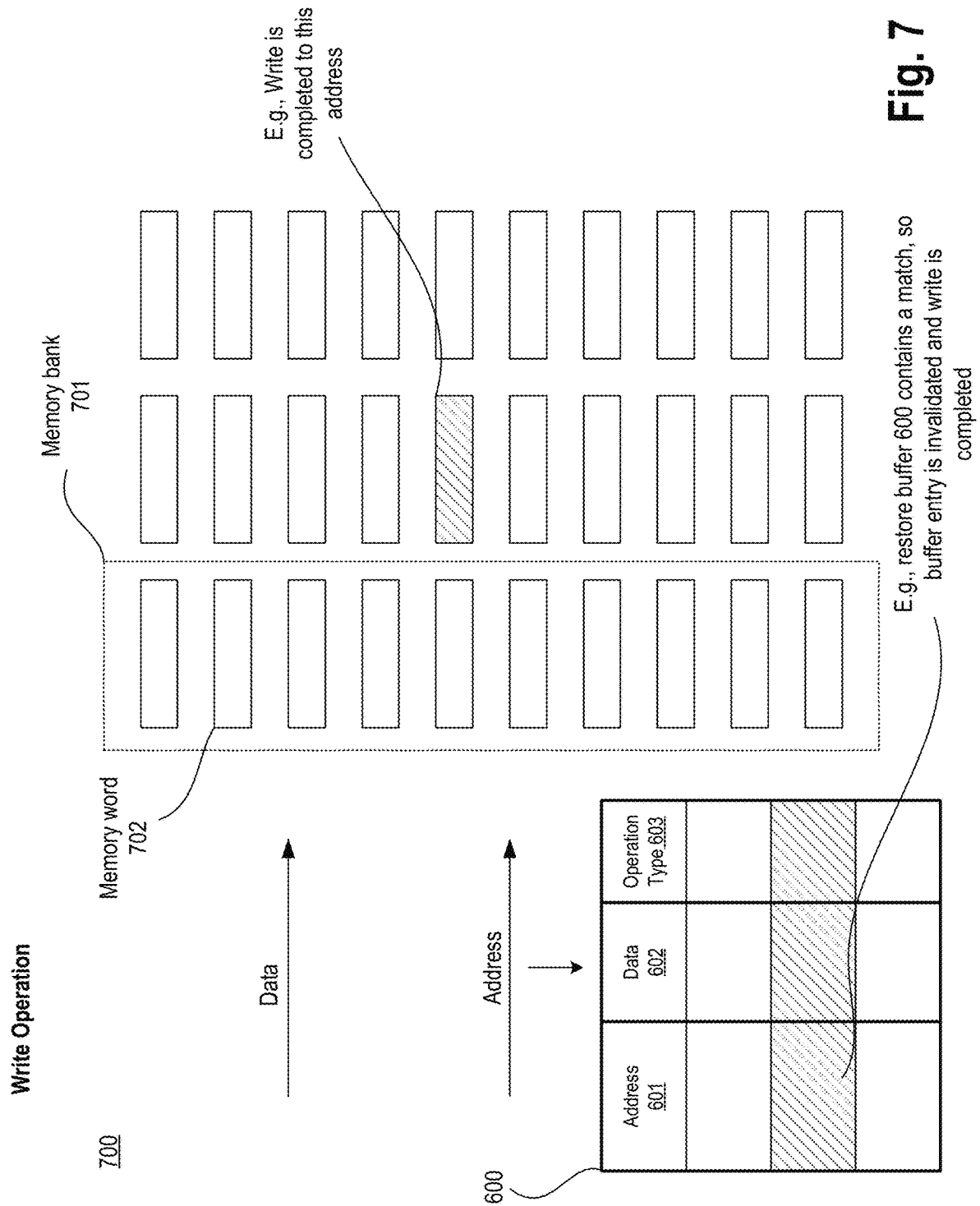
FIG. 7 illustrates a destructive read mitigation scheme during write operation where the restore buffer contains a match, in accordance with some embodiments.

FIG. 7 illustrates destructive read mitigation scheme 700 during write operation where the restore buffer contains a match, in accordance with some embodiments. Memory 101 is organized in memory banks 701, where each memory bank has a plurality of words such as word 702. In the case of write, in some embodiments, memory controller 201 writes the data to an address in one of the memory banks 701 and invalidates a matching restore buffer entry in restore buffer 600. For example, a matching address in restore buffer 600 is erased or invalidated (by setting a bit) because the contents of that address have been updated as shown by the shaded region in the memory bank. The write data in this case is a more recent version of the address contained in restore buffer 600.

Figure 8:
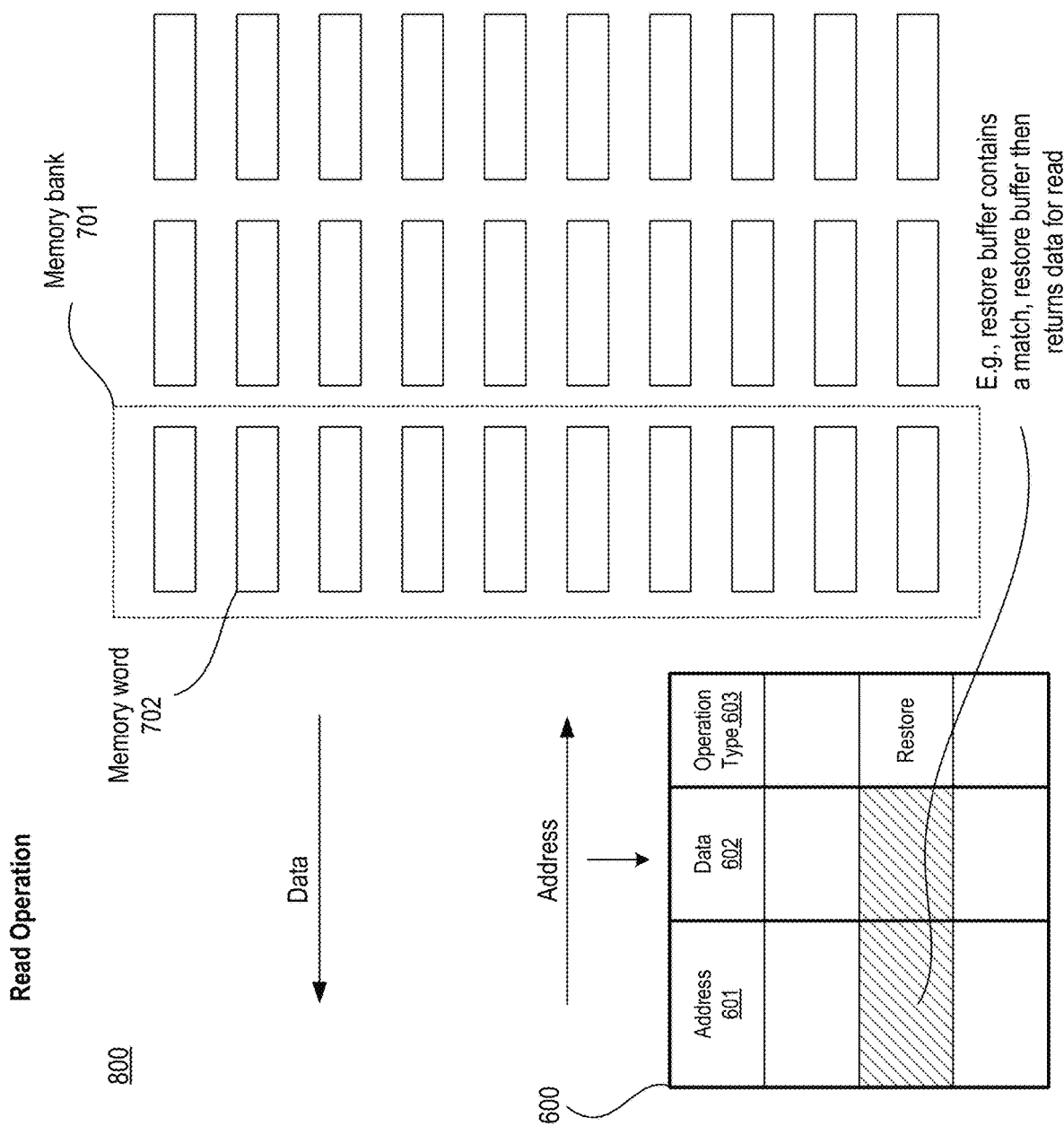
FIG. 8 illustrates a destructive read mitigation scheme during read operation where the restore buffer contains a match, in accordance with some embodiments.

FIG. 8 illustrates destructive read mitigation scheme 800 during read operation where the restore buffer contains a match, in accordance with some embodiments. In some embodiments, memory controller 201 checks restore buffer 600 first before checking the memory bank for the word to read. For example, memory controller 201 compares an address with addresses of restore buffer 600 to determine if the address to read from is already present in restore buffer 600. If the address is present in restore buffer 600, memory controller 201 fetches the corresponding data associated with that address. The corresponding data is also stored in restore buffer 600. In this case, it may not be necessary to read the memory array since the requested data has already found in restore buffer 600.

Figure 9:
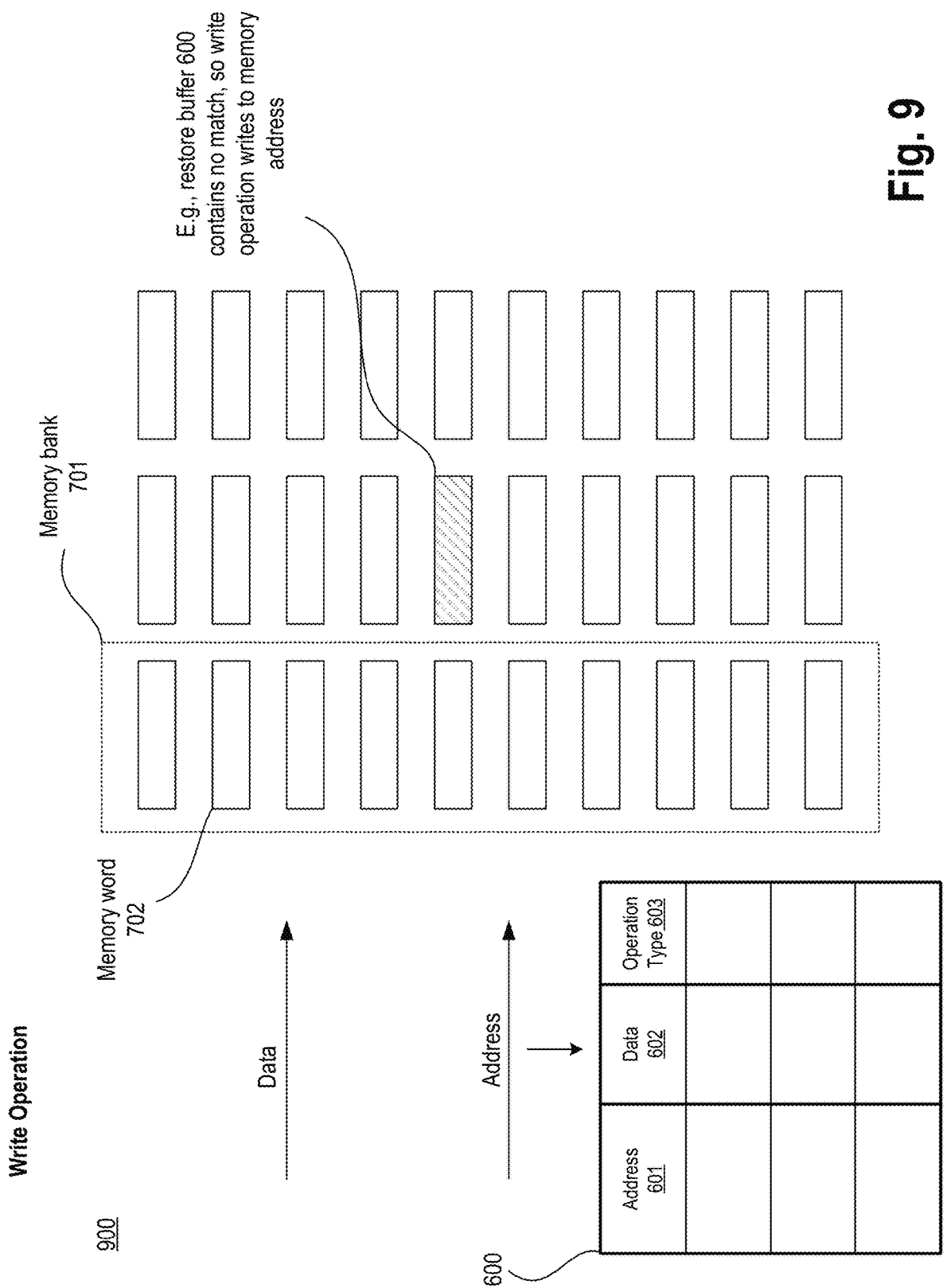
FIG. 9 illustrates a destructive read mitigation scheme during write operation where the restore buffer contains no match, in accordance with some embodiments.

FIG. 9 illustrates destructive read mitigation scheme 900 during write operation where the restore buffer contains no match, in accordance with some embodiments. In the case of a write, the data is written to memory and after the absence of a matching address in restore buffer 600 is confirmed no further operations involving restore buffer 600 are made.

Figure 10:
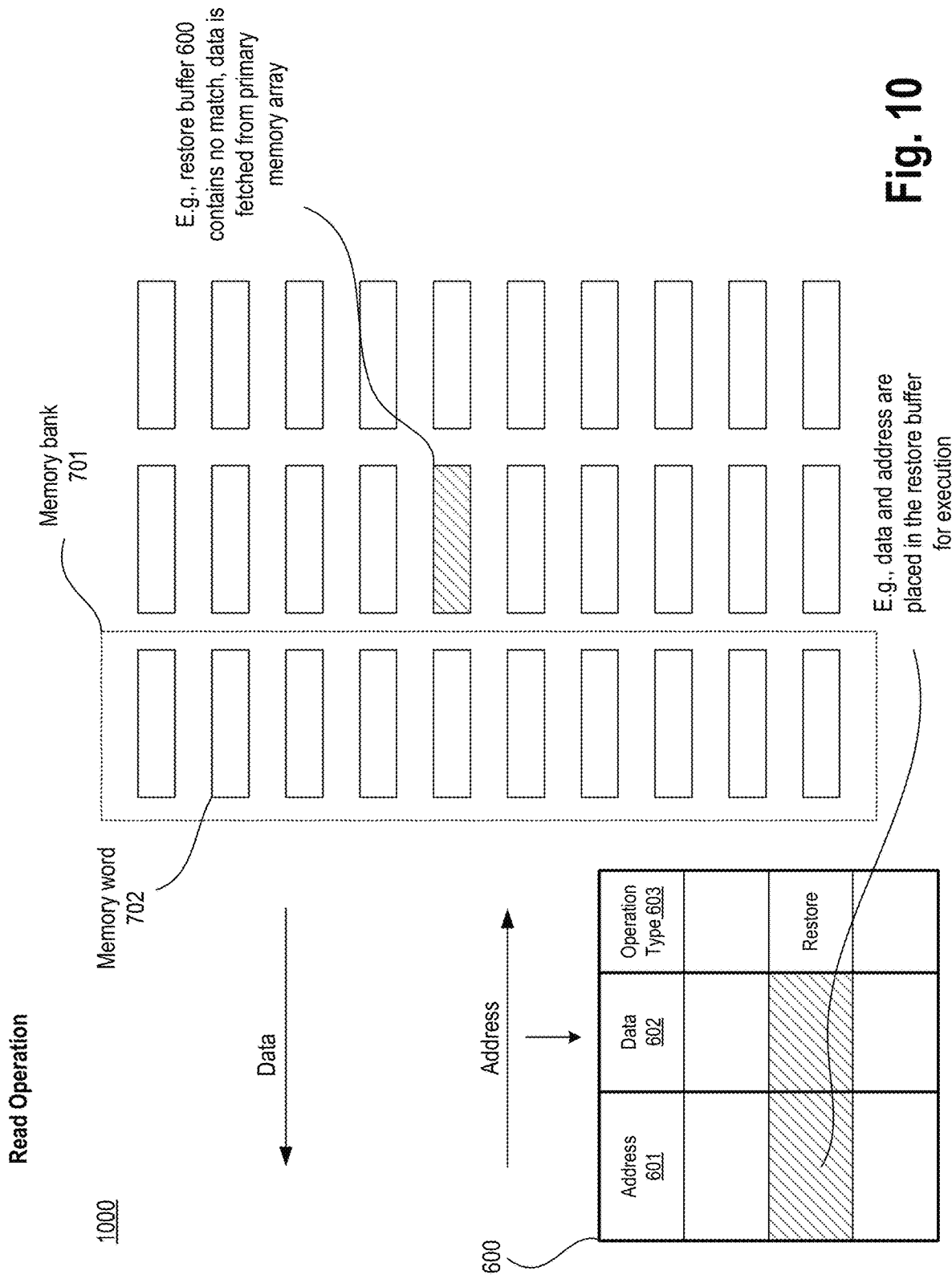
FIG. 10 illustrates a destructive read mitigation scheme during read operation where the restore buffer contains no match, in accordance with some embodiments.

FIG. 10 illustrates destructive read mitigation scheme 1000 during read operation where the restore buffer contains no match, in accordance with some embodiments. In the case of a read, restore buffer 600 is checked and no match is found. Based on no address being found in restore buffer 600, the memory array is read, and the data returned to the requestor (e.g., memory controller 201). In addition, the data and address are written to restore buffer 600. Since the read may have corrupted data in memory, a restore operation is created and placed in restore buffer 600 for future execution.

Figure 11A:
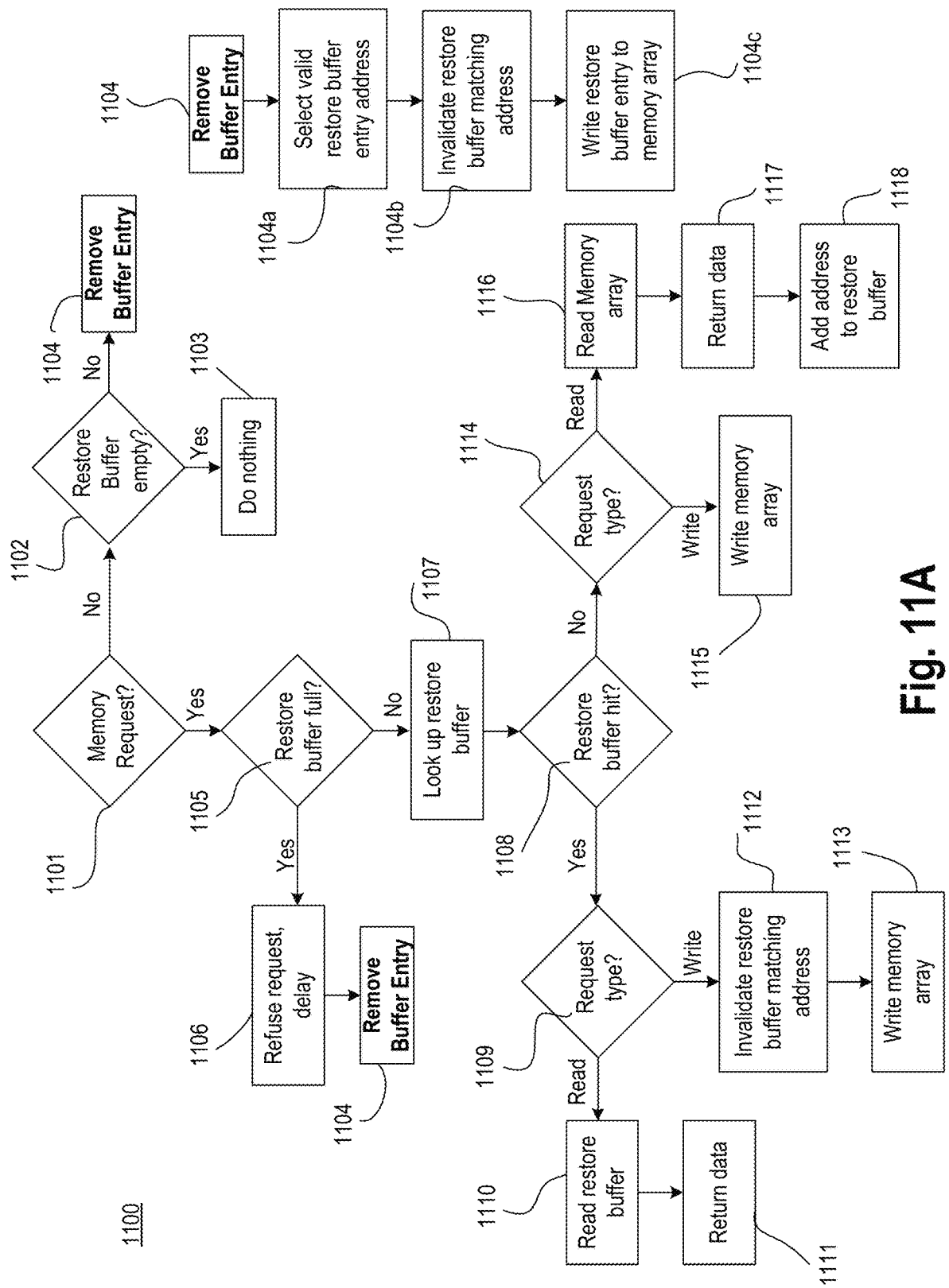
FIG. 11A illustrates a flowchart of a method for the destructive read mitigation scheme, in accordance with some embodiments.

FIG. 11A illustrates flowchart 1100 of a method for the destructive read mitigation scheme, in accordance with some embodiments. While various blocks are shown in a particular order, the order can be modified. For example, some blocks may be performed before others and some blocks may be performed in parallel. One, some, or all blocks in flowchart 1100 can be performed by hardware (e.g., memory controller 201), software, or a combination of them.

At block 1101, memory controller 201 determines whether it needs to clear up restore buffer 600. If memory controller 201 determines that no memory request is issued yet, the process proceeds to block 1102. When the memory is initialized, restore buffer 600 is empty (e.g., all restore buffer entries are invalidated). As memory requests occur, restore buffer 600 accumulates valid entries. As restore buffer 600 accumulates valid entries it takes advantage of idle memory cycles to complete restores and invalidates them in the restore buffer creating free entries for future reads/restores. In this way, small restore buffers can provide sufficient capacity for a very large memory. If restore buffer 600 is empty, nothing is done as indicated by block 1103 because restore buffer 600 is already empty. If restore buffer 600 is not empty, then the process proceeds to block 1104 where one or more entries in restore buffer 600 are removed or invalidated. The process of block 1104 is illustrated by blocks 1104a, 1104b, and 1104c. At block 1104a, a valid entry address in restore buffer 600 is selected. At block 1104b, the selected entry is invalidated. At block 1104c, restore buffer entry is written to the memory array. In various embodiments, if memory controller 201 issues a memory request then memory controller 201 checks every cycle whether restore buffer 600 is full as indicated by block 1105. If restore buffer 600 is full (e.g., no entries are invalid), memory controller 201 creates a new entry in restore buffer 600 by completing one of the waiting restores which takes priority as indicated by block 1106. In this case, memory controller 201 delays the memory request and updates restore buffer 600 with a waiting restore.

Referring to block 1105, when restore buffer 600 contains at least one valid entry (e.g., restore buffer 600 is not full), memory controller 201 handles memory requests. This is done to ensure that reads will always have at least one restore buffer entry. There are a variety of algorithms that can manage the occupancy of restore buffer 600. Some algorithms force restore buffer removals (blocks 1104) before buffer 600 is full, and the number of restores completed varies depending on the algorithm. Variations of these algorithms are beyond the scope of this disclosure.

Once at least one entry in restore buffer 600 is identified, pending memory requests are checked. At any time, a memory request is not pending, additional entries from restore buffer 600 is written back to memory. This is done to maximize the number of invalid entries in the restore buffer so that future reads/restores can be inserted while avoiding condition in block 1105 and the subsequent delay in block 1106. If restore buffer 600 is not full, then memory controller 201 looks up restore buffer 600 for a matching address in the address field of restore buffer 600 as indicated by block 1107. If a matching address is identified (e.g., the address of the memory request matches with an address of restore buffer 600) in restore buffer 600 as indicated by block 1108, then the process proceeds to block 1109. Otherwise, the process proceeds to block 1114. At block 1109, memory controller 201 determines whether the memory request is a read request or a write request.

If the memory request is a read request and restore buffer 600 hit is identified, then at block 1110, memory controller 201 reads the data from the matched address in restore buffer 600. The read data is then returned from memory 202 to memory controller 201 at block 1111. If the memory request is a write request and there was a matching hit in restore buffer 600, the process proceeds to block 1112. At block 1112, memory controller invalidates the matching entry in restore buffer 600. At block 1113, memory controller 201 then writes the data to the address in memory array 202.

If no hit is found in restore buffer 600, the process proceeds to block 1114. If the memory request is a read request and no hit is identified in restore buffer 600, then at block 1116, memory controller 201 reads the data from memory 202. The read data is returned to memory controller 201 at block 1117. At block 1118, memory controller then adds the address and associated data in restore buffer 600. If the memory request is a write request and no hit is identified in restore buffer 600, then at block 1115, memory controller 201 writes the data to memory 202. Some memories are non-volatile and can be completely powered down while retaining their state. If this is the case, the restore buffer is flushed (all entries written back to memory) before powering down the memory array, in accordance with some embodiments.

Figure 11B:
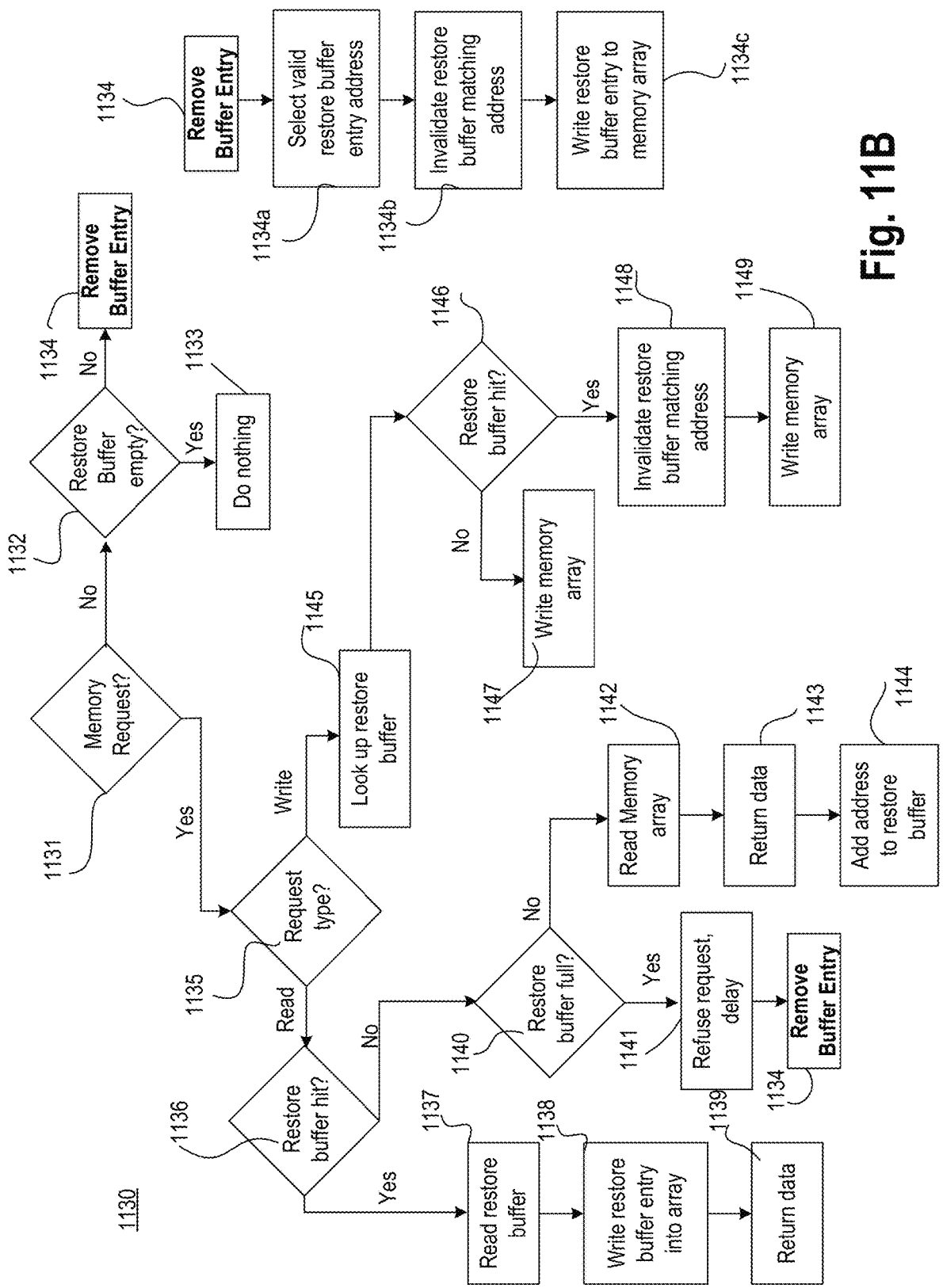
FIG. 11B illustrates a flowchart of a method for the destructive read mitigation scheme, in accordance with some embodiments.

FIG. 11B illustrates flowchart 1130 of a method for the destructive read mitigation scheme, in accordance with some embodiments. Flowchart 1130 is similar to flowchart 1100. Since read operation that misses the restore buffer requires a restore buffer entry, both write and reads that match a restore buffer entry can proceed even when the restore buffer is full. In the case where the restore buffer is full, incoming read operations and their associated entry in restore buffer 600 can be prioritized before other requests are accepted. In some embodiments, when the restore buffer is full, incoming read request is moved to a temporary buffer to wait until an idle cycle is available and the request could be handled. In some embodiments, memory 101 or any suitable logic can send a response to memory controller 201 to ask the requester to re-send the request.

At block 1131, memory controller 201 determines whether it needs to clear up restore buffer 600. If memory controller 201 determines that no memory request is issued yet, the process proceeds to block 1132. When the memory is initialized, restore buffer 600 is empty (e.g., all restore buffer entries are invalidated). As memory requests occur, restore buffer 600 accumulates valid entries. If restore buffer 600 is empty, nothing is done as indicated by block 1133 because restore buffer 600 is already empty. If restore buffer 600 is not empty, then the process proceeds to block 1134 where one or more entries in restore buffer 600 are removed or invalidated. The process of block 1134 is illustrated by blocks 1134*a*, 1134*b*, and 1134*c*. At block 1134*a*, a valid entry address in restore buffer 600 is selected. At block 1134*b*, the selected entry is invalidated. At block 1134*c*, restore buffer entry is written to the memory array. In various embodiments, if memory controller 201 issues a memory request, then the process proceeds to block 1135 to determine the kind of request.

If it is determined that the request is a read request, the process proceeds to block 1136. At block 1136, memory controller 201 determines whether an address associated with the read request is found in restore buffer 600 (e.g., whether there is an address hit in buffer 600). If there is an address hit, the process proceeds to block 1137 where restore buffer is read for the data associated with the address of read request. At block 1138, memory controller 201 writes restore buffer entry into memory array 202. At block 1139, data from restore buffer 600 associated with that address is returned to memory controller 201.

If at block 1136, memory controller 201 determines that there is no hit in restore buffer 600 (e.g., the address associated with the read request is not found in restore buffer 600), then at block 1140 memory controller 201 determines whether restore buffer 600 is full. If restore buffer 600 is full, the process proceeds to block 1141 where the read request is refused or delayed by a predetermined time or programmable time. The process then proceeds to block 1134.

If at block 1140 memory controller 201 determines that restore buffer 600 is not full, then the read request is processed and memory array 202 is read from the address associated with the read request as indicated by block 1142. The read data is then returned to memory controller 201 at block 1143. At block 1144, the memory address that is read from is added to restore buffer 600.

At block 1135 if it is determined that the memory request is a write request, the process proceeds to block 1145 where restore buffer is checked for a matching address. At block 1146, if a matching address is not found, then memory array 101 is written at block 1147 to the address associated with the write request. If at block 1146 it is determined that there is a matching address in restore buffer 600, then the process proceeds to block 1148 where the entry associated with the matching address is invalidated. At block 1149, data to the address associated with memory array 101 is then written.

The various embodiments including flowcharts 1100 and 1130 are executed by software, hardware, or a combination of them. In some embodiments, the software includes machine-readable instructions that are executed by one or more machines (e.g., computer, processor, memory controller, one or more circuitries, etc.). These machine-readable instructions are stored in a machine-readable storage media (e.g., memory).

Elements of embodiments are also provided as a machine-readable medium (e.g., memory) for storing the computer-executable instructions (e.g., instructions to implement any other processes discussed herein). In some embodiments, a computing platform comprises a memory, a processor, a machine-readable storage media (also referred to as tangible machine readable medium), a communication interface (e.g., wireless or wired interface), and a network bus coupling them.

In some embodiments, the processor is a Digital Signal Processor (DSP), an Application Specific Integrated Circuit (ASIC), a general-purpose Central Processing Unit (CPU), or a low power logic implementing a simple finite state machine to perform the method of various embodiments, etc.

In some embodiments, the various logic blocks of the system are coupled together via the network bus. Any suitable protocol may be used to implement the network bus. In some embodiments, the machine-readable storage medium includes instructions (also referred to as the program software code/instructions) for improving memory bandwidth through read and restore decoupling as described with reference to the various embodiments and flowchart.

Program software code/instructions associated with flowcharts 1100 and 1130 (and/or various embodiments), executed to implement embodiments of the disclosed subject matter may be implemented as part of an operating system or a specific application, component, program, object, module, routine, or other sequence of instructions or organization of sequences of instructions referred to as "program software code/instructions," "operating system program software code/instructions," "application program software code/instructions," or simply "software" or firmware embedded in processor. In some embodiments, the program software code/instructions associated with flowchart 1100 (and/or various embodiments) are executed by the computer system.

In some embodiments, the program software code/instructions associated with flowcharts 1100 and 1130 (and/or various embodiments) are stored in a computer executable storage medium and executed by the processor. Here, computer executable storage medium is a tangible machine-readable medium that can be used to store program software code/instructions and data that, when executed by a computing device, causes one or more processors to perform a method(s) as may be recited in one or more accompanying claims directed to the disclosed subject matter.

The software program code/instructions (associated with flowcharts 1100, 1130 and other embodiments) and data can be obtained in their entirety prior to the execution of a respective software program or application by the computing device. Alternatively, portions of the software program code/instructions and data can be obtained dynamically, e.g., just in time, when needed for execution. Alternatively, some combination of these ways of obtaining the software program code/instructions and data may occur, e.g., for different applications, components, programs, objects, modules, routines or other sequences of instructions or organization of sequences of instructions, by way of example. Thus, it is not required that the data and instructions be on a tangible machine-readable medium in entirety at a particular instance of time.

The tangible machine-readable medium may include storage of the executable software program code/instructions and data in various tangible locations, including for example ROM, volatile RAM, non-volatile memory and/or cache and/or other tangible memory as referenced in the present application. Portions of this program software code/instructions and/or data may be stored in any one of these storage and memory devices. Further, the program software code/ instructions can be obtained from other storage, including, e.g., through centralized servers or peer to peer networks and the like, including the Internet. Different portions of the software program code/instructions and data can be obtained at different times and in different communication sessions or in the same communication session.

Examples of tangible computer-readable media include but are not limited to recordable and non-recordable type media such as volatile and non-volatile memory devices, read only memory (ROM), random access memory (RAM), flash memory devices, magnetic random-access memory, ferroelectric memory, floppy and other removable disks, magnetic storage media, optical storage media (e.g., Compact Disk Read-Only Memory (CD ROMS), Digital Versatile Disks (DVDs), etc.), among others. The software program code/instructions may be temporarily stored in digital tangible communication links while implementing electrical, optical, acoustical or other forms of propagating signals, such as carrier waves, infrared signals, digital signals, etc. through such tangible communication links.

In general, the tangible machine readable medium includes any tangible mechanism that provides (i.e., stores and/or transmits in digital form, e.g., data packets) information in a form accessible by a machine (i.e., a computing device), which may be included, e.g., in a communication device, a computing device, a network device, a personal digital assistant, a manufacturing tool, a mobile communication device, whether or not able to download and run applications and subsidized applications from the communication network, such as the Internet, or any other device including a computing device.

FIG. 12 illustrates various kinds of planar ferroelectric capacitors 1200, 1210, 1220, and 1230 for use in the memory area, which is mitigated for destructive read, in accordance with some embodiments. FE capacitor 1200 comprises refractive inter-metallic 1211$a/b$ as a barrier material; conductive oxides 1212$a/b$, and FE material 1213. Refractive inter-metallic 1211$a/b$ maintains the FE properties of the FE capacitor Cfe. In the absence of refractive inter-metallic 1211$a/b$, the ferroelectric material or the paraelectric material 1213 of the capacitor may lose its potency. In some embodiments, refractive inter-metallic 1211$a/b$ comprises Ti and Al (e.g., TiAl compound). In some embodiments, refractive inter-metallic 1211$a/b$ comprises one or more of Ta, W, and/or Co.

For example, refractive inter-metallic 1211$a/b$ includes a lattice of Ta, W, and Co. In some embodiments, refractive inter-metallic 1211$a/b$ includes one of: Ti—Al such as Ti3Al, TiAl, TiAl3; Ni—Al such as Ni3Al, NiAl3, NiAl; Ni—Ti, Ni—Ga, Ni2MnGa; FeGa, Fe3Ga; or borides, carbides, or nitrides. In some embodiments, TiAl material comprises Ti-(45-48)Al-(1-10)M (at. X trace amount %), with M being at least one element from V, Cr, Mn, Nb, Ta, W, and Mo, and with trace amounts of 0.1-5% of Si, B, and/or Mg. In some embodiments, TiAl is a single-phase alloy γ(TiAl). In some embodiments, TiAl is a two-phase alloy γ(TiAl)+α2(Ti3Al). Single-phase γ alloys contain three alloying elements such as Nb or Ta that promote strengthening, and additionally enhance oxidation resistance. The role of the third alloying elements in the two-phase alloys is to raise ductility (V, Cr, Mn), oxidation resistance (Nb, Ta) or combined properties. Additions such as Si, B, and Mg can markedly enhance other properties. Barrier layer 1211$a$ is coupled to a plate-line or power-line (PL).

In some embodiments, sidewall barrier seal 1221$a$ and 1221$b$ (comprising insulating material such as Ti—Al—O, Al2O3, or MgO) is placed around layers 1211$a$, 1212$a$, 1213, 1212$b$, and 1211$b$ while the top surface of 1211$a$ and the bottom surface of 1211$b$ are exposed for coupling to metal layers, vias, or a metallic pedestal. In some embodiments, sidewall barrier seals 1221$a$, 1221$b$, 1221$c$, and 1221$d$ (insulating material such as Ti—Al—O, Al2O3, or MgO) are placed around layers 1211$a$, 1212$a$, 1213, 1212$b$, and 1211$b$ and part of the top surface of 1211$a$ and part of the bottom surface of 1211$b$ are exposed for coupling to metal layers or electrodes, vias, or a metallic pedestal. In some embodiments, sidewall barrier seal 1221$a$, 1221$b$, 1221$c$, 1221$d$, 1221$e$, and 1221$f$ (insulating material such as Ti—Al—O, Al2O3, or MgO) is placed around layers 1211$a$, 1212$a$, 1213, 1212$b$, and 1211$b$ and part of the top surfaces of 1211$c$ and 1211$d$ and bottom surface 1221$e$ and 1221$f$ are exposed for coupling to metal layers or electrodes, vias, or a metallic pedestal.

In various embodiments, FE material 1213 can be any suitable low voltage FE material that allows the FE material to switch its state by a low voltage (e.g., 100 mV). Threshold in FE material 1213 has a highly non-linear transfer function in the polarization vs. voltage response. The threshold is related to: a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of FE layer 1213. A perfect epitaxial, single crystalline FE layer will show higher squareness (e.g., ratio is closer to 1) compared to a poly crystalline FE. This perfect epitaxial can be accomplished using lattice matched bottom and top electrodes (1201$b$ and 1201$a$, respectively). In one example, BiFeO (BFO) can be epitaxially synthesized using a lattice matched SrRuO3 bottom electrode yielding P-E loops that are square. Progressive doping with La will reduce the squareness.

In some embodiments, FE material 1213 comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or Lanthanides).

In some embodiments, FE material 1213 is perovskite, which includes one or more of: La, Sr, Co, Sr, Ru, Y, Ba, Cu, Bi, Ca, and Ni. For example, metallic perovskites such as: $(La,Sr)CoO_3$, $SrRuO_3$, $(La,Sr)MnO_3$, $YBa_2Cu_3O_7$, $Bi_2Sr_2CaCu_2O_8$, $LaNiO_3$, etc. may be used for FE material 1213. Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves spontaneous distortion in the range of 0.3 to 2%. For chemically substituted BiFeO3, BiCrO3, BiCoO3 class of materials, La or rare earth substitution into the Bi site can tune the spontaneous distortion, or any combination of $Bi_xFe_yO_z$ with La or rare earth doping. In some embodiments, FE material 1213 is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, and LaNiO3.

In some embodiments, FE material 1213 comprises a stack of layers including low voltage FE material between (or sandwiched between) conductive oxides. In various embodiments, when FE material 1213 is a perovskite, the conductive oxides are of the type AA'BB' O$_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability. In various embodiments, when metallic perovskite is used for FE material 1213, conductive oxides 1212*a/b* can include one or more of: IrO$_2$, RuO$_2$, PdO$_2$, OsO$_2$, or ReO$_3$. In some embodiments, the perovskite is doped with La or Lanthanides. In some embodiments, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectrics at low temperatures, are used as conductive oxides 1212*a/b*. In some embodiments, perovskite includes one of: BaTiO3, PbTiO3, KNbO3, or NaTaO3.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is –0.05, and y is 0.95), HfZrO2, Hf—Si—O, La-substituted PbTiO3, and PMN-PT based relaxor ferroelectrics.

In some embodiments, FE material 1213 comprises one or more of: Hafnium (Hf), Zirconium (Zr), Aluminum (Al), Silicon (Si), their oxides or their alloyed oxides. In some embodiments, FE material 1213 includes one or more of: Al(1–x)Sc(x)N, Ga(1–x)Sc(x)N, Al(1–x)Y(x)N or Al(1–x–y)Mg(x)Nb(y)N, x doped HfO2, where x includes one of: Al, Ca, Ce, Dy, Er, Gd, Ge, La, Sc, Si, Sr, Sn, Zr, or Y, wherein 'x' is a fraction. In some embodiments, FE material 1213 includes one or more of: Bismuth ferrite (BFO), lead zirconate titanate (PZT), BFO with doping material, or PZT with doping material, wherein the doping material is one of Nb or La; and relaxor ferroelectrics such as PMN-PT.

In some embodiments, FE material 1213 includes Bismuth ferrite (BFO), BFO with a doping material wherein the doping material is one of Lanthanum, or any element from the lanthanide series of the periodic table. In some embodiments, FE material 1213 includes lead zirconium titanate (PZT), or PZT with a doping material, wherein the doping material is one of La, Nb. In some embodiments, FE material 1213 includes a relaxor ferroelectric, which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST).

In some embodiments, FE material 1213 includes Hafnium oxides of the form, Hf1–x Ex Oy where E can be Al, Ca, Ce, Dy, er, Gd, Ge, La, Sc, Si, Sr, Sn, or Y. In some embodiments, FE material 1213 includes Niobate type compounds LiNbO3, LiTaO3, Lithium iron Tantalum Oxy Fluoride, Barium Strontium Niobate, Sodium Barium Niobate, or Potassium strontium niobate.

In some embodiments, FE material 1213 comprises multiple layers. For example, alternating layers of [Bi2O2]2+, and pseudo-perovskite blocks (Bi4Ti3O12 and related Aurivillius phases), with perovskite layers that are n octahedral layers in thickness can be used. In some embodiments, FE material 1213 comprises organic material. For example, Polyvinylidene fluoride or polyvinylidene difluoride (PVDF).

In some embodiments, FE material 1213 comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of YMnO3 or LuFeO3, and/or other variants of LuxFeyOz (where 'x', 'y', and 'z' are numbers or fractions). In various embodiments, when FE material 1213 comprises hexagonal ferroelectrics, the conductive oxides are of A2O3 (e.g., In2O3, Fe2O3) and ABO3 type, where 'A' is a rare earth element and B is Mn, transition metal dichalcogenides (TMD) or chalcogenide of the type AB2, where 'A' is a transition metal and 'B' is a chalcogen.

In some embodiments, FE material 1213 comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. While various embodiments here are described with reference to ferroelectric material 1213 for storing the charge state, the embodiments are also applicable for paraelectric material. For example, the capacitor of various embodiments can be formed using paraelectric material instead of ferroelectric material.

While various embodiments here are described with reference to ferroelectric material for storing the charged state, the embodiments are also applicable for paraelectric material. For example, material 1213 of various embodiments can be formed using paraelectric material instead of ferroelectric material. In some embodiments, paraelectric material includes one of: SrTiO3, Ba(x)Sr(y)TiO3 (where x is –0.5, and y is 0.95), HfZrO2, Hf—Si—O, La-substituted PbTiO3, lead zirconate titanate (PZT), or lead magnesium niobate-lead titanate (PMN-PT) based relaxor ferroelectrics.

In some embodiments, thickness $t_{111}$ of refractive inter-metallic layer 1211*a/b* is in a range of 1 nm to 25 nm. In some embodiments, thickness $t_{112}$ of the conductive oxide layers 1212*a/b* is in a range of 1 nm to 25 nm. In some embodiments, thickness $t_{113}$ of the FE material (e.g., perovskite, hexagonal ferroelectric, or improper ferroelectric) 1213*a/b* is in a range of 1 nm to 25 nm. In some embodiments, the lateral thickness $t_{120}$ of the sidewall barrier seal 1221*a/b* (insulating material) is in a range of 0.1 nm to 40 nm. In some embodiments, the lateral thickness $L_{Cfe}$ of the capacitive structure (without sidewall barrier) is in a range of 5 nm 400 nm. In some embodiments, the height $H_{Cfe}$ of the capacitive structure is in a range of 1 nm 200 nm. In some embodiments, the FE capacitive structure is without refractive inter-metallic layers 1211*a/b*. In that case, conductive oxides layers 1212a/b are in direct contact with the contacts, vias, or metals (e.g., PL or source/drain region contact of transistor MN). In some embodiments, sidewall barrier seal 1221a/b is not present. In one such embodiment, the sidewalls of the layers 1211a/b, 1212a/b, and 1213 are in direct contact with ILD (interlayer dielectric) such as SiO2.

FIG. 13 illustrates a pillar ferroelectric capacitor 1300 for use in the memory area which is mitigated for destructive read, in accordance with some embodiments. In various embodiments, FE pillar capacitor 1300 is cylindrical in shape. In some embodiments, FE pillar capacitor 1300 is rectangular in shape. Taking the cylindrical shaped case for example, in some embodiments, the layers of FE pillar capacitor 1300 from the center going outwards include oxide scaffolding 1302, bottom electrode 1301a, first conductive oxide 1312a, FE material 1313, second conductive oxide 1312b, and top electrode 1301b. A cross-sectional view along the "ab" dashed line is illustrated in the middle of FIG. 13. In some embodiments, bottom electrode 1301a is conformally deposited over oxide scaffolding 1302 (e.g., $SiO_2$ or any other suitable dielectric). In some embodiments, first conductive oxide 1312a is conformally deposited over bottom electrode 1301a. In some embodiments, FE material 1313 is conformally deposited over first conductive oxide 1312a. In some embodiments, second conductive oxide 1312b is conformally deposited over FE material 1313. In some embodiments, top electrode 1301b is conformally deposited over second conductive oxide 1312b. In some embodiments, the oxide scaffolding is etched and metal is deposited into it which becomes part of bottom electrode 1301a. In some embodiments, a top section of FE pillar capacitor 1300 that forms an upside-down 'U' shape is chopped off (e.g., by etching). This allows bottom electrode 1301a to be accessible from the top and bottom of FE pillar capacitor 1300, where bottom electrode 1301a is in the center while top electrode 1301b is on an outer circumference of FE pillar capacitor 1300.

In various embodiments, the choice of materials for FE pillar capacitor 1300 are similar to the choice of material for FE planar capacitor 1200. For example, the materials for FE pillar capacitor 1300 can be selected from a same group of materials listed for FE planar capacitor 1200 in FIG. 12. For example, material for bottom electrode 1301a corresponds to bottom electrode 1201a, material for conductive oxide 1212b corresponds to first conductive oxide 1312a, FE material 1313 corresponds to FE material 1213, material for second conductive oxide 1212a corresponds to second conductive oxide 1312b, and material for top electrode 1201b corresponds to top electrode 1301b.

In some embodiments, a first refractive inter-metallic layer (not shown) is formed between FE material 1313 and first conductive oxide 1312a. In some embodiments, a second refractive inter-metallic layer (not shown) is formed between FE material 1313 and second conductive oxide 1312b. In these cases, the first and second refractive inter-metallic layers are directly adjacent to their respective conductive oxide layers and to FE material 1313. The refractive inter-metallic layer maintains the FE properties of FE material 1313. In the absence of a refractive inter-metallic layer, the ferroelectric material 1313 (or the paraelectric material) of pillar capacitor 1300 may lose its potency. In some embodiments, refractive inter-metallic layer comprises Ti and Al (e.g., TiAl compound). In some embodiments, the refractive inter-metallic layer (not shown) comprises one or more of Ta, W, and/or Co. Material discussed with reference to layers 1211a and 1211b can be used for the first and second refractive inter-metallic layers. The thicknesses of the layers of FE pillar capacitor 1300 are of the same range as similar layers discussed in FIG. 12 for FE planar capacitor 1200.

Figure 14:
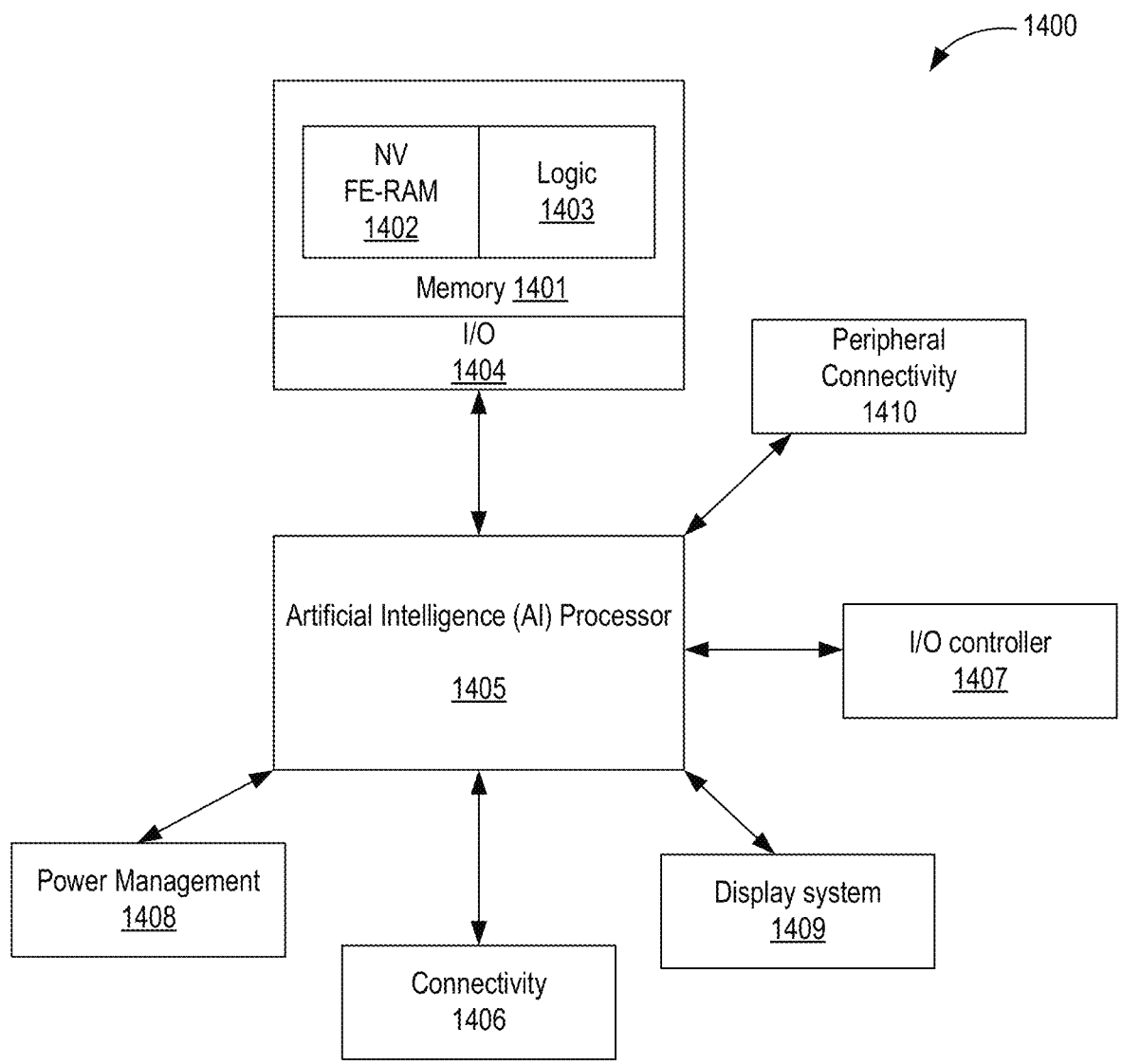
FIG. 14 illustrates a system-on-chip (SOC) that uses destructive read mitigation scheme, in accordance with some embodiments.

FIG. 14 illustrates a system-on-chip (SOC) that uses destructive read mitigation scheme, in accordance with some embodiments. The FE device structure can be formed in the back end of SOC 1400 while the transistors are formed in the front end of SOC 1400, in accordance with some embodiments. In some embodiments, the FE device structure and the transistors are formed in the back end of SOC 1400. In some embodiments, the FE device structure and the transistors are formed in the front end of SOC 1400. In some embodiments, SOC 1400 comprises memory 1401 having static random-access memory (SRAM) or FE based random access memory FE-RAM, or any other suitable memory. The memory can be non-volatile (NV) or volatile memory. Memory 1401 may also comprise logic 1403 to control memory 1402. For example, write and read drivers are part of logic 1403. These drivers and other logic are implemented using the majority or threshold gates of various embodiments. The logic can comprise majority or threshold gates and traditional logic (e.g., CMOS based NAND, NOR etc.).

SOC further comprises a memory I/O (input-output) interface 1404. The interface may be a double-data rate (DDR) compliant interface or any other suitable interface to communicate with a processor. Processor 1405 of SOC 1400 can be a single core or multiple core processor. Processor 1405 can be a general-purpose processor (CPU), a digital signal processor (DSP), a graphics processing unit (GPU), or an Application Specific Integrated Circuit (ASIC) processor. In some embodiments, processor 1405 is an artificial intelligence (AI) processor (e.g., a dedicated AI processor, a processor circuitry, a graphics processor configured as an AI processor). In various embodiments, processor 1405 (or processor circuitry 1405) is configured to execute one or more instructions.

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, AI processor 1405 has reduced latency of computing the training model and using the training model, which reduces the power consumption of such AI processor systems.

Processor 1405 may be coupled to a number of other chiplets that can be on the same die as SOC 1400 or on separate dies. These chiplets include connectivity circuitry 1406, I/O controller 1407, power management 1408, and display system 1409, and peripheral connectivity 1410.

Connectivity 1406 represents hardware devices and software components for communicating with other devices. Connectivity 1406 may support various connectivity circuitries and standards. For example, connectivity 1406 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 1406 may support non-cellular standards such as WiFi.

I/O controller 1407 represents hardware devices and software components related to interaction with a user. I/O controller 1407 is operable to manage hardware that is part of an audio subsystem and/or display subsystem. For example, input through a microphone or other audio device can provide input or commands for one or more applications or functions of SOC 1400. In some embodiments, I/O controller 1407 illustrates a connection point for additional devices that connect to SOC 1400 through which a user might interact with the system. For example, devices that can be attached to the SOC 1400 might include microphone devices, speaker or stereo systems, video systems or other display devices, keyboard or keypad devices, or other I/O devices for use with specific applications such as card readers or other devices.

Power management 1408 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 1408 may accordingly put such logic into low power state without the worry of losing data. Power management may select a power state according to Advanced Configuration and Power Interface (ACPI) specification for one or all components of SOC 1400.

Display system 1409 represents hardware (e.g., display devices) and software (e.g., drivers) components that provide a visual and/or tactile display for a user to interact with the processor 1405. In some embodiments, display system 1409 includes a touch screen (or touch pad) device that provides both output and input to a user. Display system 1409 may include a display interface, which includes the particular screen or hardware device used to provide a display to a user. In some embodiments, the display interface includes logic separate from processor 1405 to perform at least some processing related to the display.

Peripheral connectivity 1410 may represent hardware devices and/or software devices for connecting to peripheral devices such as printers, chargers, cameras, etc. Peripheral connectivity 1410 support communication protocols, e.g., PCIe (Peripheral Component Interconnect Express), USB (Universal Serial Bus), Thunderbolt, High Definition Multimedia Interface (HDMI), Firewire, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples illustrate various embodiments. Any one example can be combined with other examples described herein.

Example 1: An apparatus comprising: a restore buffer comprising an address field and a data field; and circuitry to determine whether there is a memory request to a memory, wherein the memory is a non-SRAM memory, and upon determination that there is a memory request, determine whether the restore buffer is full, and upon determination that there is a memory request, determine a type of memory request, and if the memory request is a read request then issue a subsequent restore request, wherein the read request is separate from the subsequent restore request.

Example 2: The apparatus of example 1, wherein the circuitry is to determine whether the restore buffer is empty if there is no memory request to the memory.

Example 3: The apparatus of example 2, wherein the circuitry is to remove an entry from the restore buffer if it is determined that the restore buffer is not empty.

Example 4: The apparatus of example 1, wherein the circuitry is to create an entry in the restore buffer if the restore buffer is not full, wherein the entry is of a restore operation in waiting.

Example 5: The apparatus of example 1, wherein the circuitry is to look up the restore buffer for an address of the memory request if the restore buffer is not full.

Example 6: The apparatus of example 5, wherein the circuitry is to determine a type of memory request if the circuitry finds an address in the restore buffer that matches with the address of the memory request.

Example 7: The apparatus of example 6, wherein the circuitry is to read data from the address in the restore buffer if the memory request is a read memory request.

Example 8: The apparatus of example 6, wherein the circuitry is to invalidate an entry in the restore buffer associated with the address that matches with the address of the memory request if the memory request is a write request, and wherein the circuitry is to write data to the memory.

Example 9: The apparatus of example 5, wherein the circuitry is to determine a type of memory request if the circuitry finds an address in the restore buffer does not match with the address of the memory request.

Example 10: The apparatus of example 9, wherein the circuitry is to read data from the memory using the address in the memory request.

Example 11: The apparatus of example 10, wherein the circuitry is to add an entry in the restore buffer with data and address of the read data and the address in the memory request.

Example 12: The apparatus of example 1, wherein the restore buffer comprises static random-access memory.

Example 13: The apparatus of example 5, wherein the circuitry is to write data in the memory using the address of the memory request.

Example 14: The apparatus of example 1, wherein the memory comprises one of a ferroelectric memory or a dynamic random-access memory.

Example 15: The apparatus of example 14, wherein the ferroelectric memory comprises non-linear polar material which includes one of: ferroelectric material, paraelectric material, or non-linear dielectric.

Example 16: The apparatus of example 15, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, or Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite which includes one of BaTiO3, PbTiO3, KNbO3, or NaTaO3; hexagonal ferroelectric which includes one of YMnO3, or LuFeO3; hexagonal ferroelectrics of a type h-RMnO3, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides such as Hf1−x Ex Oy, where E can be Al, Ca, Ce, Dy, Er, Gd, Ge, La, Sc, Si, Sr, Sn, Zr, or Y; Al(1−x)Sc(x)N, Ga(1-x)Sc(x)N, Al(1−x)Y(x)N or Al(1−x-y)Mg(x)Nb(y)N, y doped HfO2, where x includes one of Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric which includes one of [PTO/STO]n or [LAO/STO]n, where 'n' is between 1 to 100.

Example 17: A system comprising: a memory to store one or more instructions; a processor circuitry to execute the one or more instructions; and a communication interface to allow the processor circuitry to communicate with one or more devices, wherein the processor circuitry is an apparatus according to any one of examples 1 to 17.

Example 18: An apparatus comprising: a buffer comprising static random-access memory, wherein the buffer is to store a copy of data and its address, wherein the copy corresponds to a data and address in a non-volatile memory; and a circuitry to determine whether there is a memory request to the non-volatile memory, and upon determination that there is a memory request, determine whether the buffer is full.

Example 19: The apparatus of example 18, wherein the circuitry is to determine whether the buffer is empty if there is no memory request to the non-volatile memory, and wherein the circuitry is to remove an entry from the buffer if it is determined that the buffer is empty.

Example 1b: A method comprising: determining whether there is a memory request to a memory, wherein the memory is a non-SRAM memory; upon determination that there is a memory request, determining whether a restore buffer is full, wherein the restore buffer has an address field and a data field; upon determination that there is a memory request, determining a type of memory request; and issuing a subsequent restore request if the memory request is a read request, wherein the read request is separate from the subsequent restore request.

Example 2b: The method of example 1b comprising determining whether the restore buffer is empty if there is no memory request to the memory.

Example 3b: The method of example 2b comprising removing an entry from the restore buffer if it is determined that the restore buffer is not empty.

Example 4b: The method of example 1b comprising creating an entry in the restore buffer if the restore buffer is not full, wherein the entry is of a restore operation in waiting.

Example 5b: The method of example 1b comprising looking up the restore buffer for an address of the memory request if the restore buffer is not full.

Example 6b: The method of example 5b comprising determining a type of memory request if an address is found in the restore buffer that matches with the address of the memory request.

Example 7b: The method of example 6b comprising reading data from the address in the restore buffer if the memory request is a read memory request.

Example 8b: The method of example 6b comprising: invalidating an entry in the restore buffer associated with the address that matches with the address of the memory request if the memory request is a write request; and writing data to the memory.

Example 9b: The method of example 8b comprising determining a type of memory request if an address is found in the restore buffer which does not match with the address of the memory request.

Example 10b: The method of example 9b, comprising reading data from the memory using the address in the memory request.

Example 11b: The method of example 10b comprising adding an entry in the restore buffer with data and address of the read data and the address in the memory request.

Example 12b: The method of example 1b, wherein the restore buffer comprises static random-access memory.

Example 13b: The method of example 5b comprising writing data in the memory using the address of the memory request.

Example 14b: The method of example 1b, wherein the memory comprises one of a ferroelectric memory or a dynamic random-access memory.

Example 15b: The method of example 14b, wherein the ferroelectric memory comprises non-linear polar material which includes one of: ferroelectric material, paraelectric material, or non-linear dielectric.

Example 16b: The method of claim 15, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, or Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); a perovskite which includes one of BaTiO3, PbTiO3, KNbO3, or NaTaO3; a hexagonal ferroelectric which includes one of YMnO3, or LuFeO3; hexagonal ferroelectrics of a type h-RMnO3, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hf1−x Ex Oy, where E can be Al, Ca, Ce, Dy, Er, Gd, Ge, La, Sc, Si, Sr, Sn, Zr, or Y; Al(1−x)Sc(x)N, Ga(1−x)Sc(x)N, Al(1−x)Y(x)N or Al(1−x−y)Mg(x)Nb(y)N, y doped HfO2, where x includes one of Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or an improper ferroelectric which includes one of [PTO/STO]n or [LAO/STO]n, where 'n' is between 1 to 100.

Example 17b: A method comprising: storing a copy of data and its address into a buffer, wherein the copy corresponds to a data and address in a non-volatile memory, wherein the buffer comprises static random-access memory; determining whether there is a memory request to the non-volatile memory; and upon determining that there is a memory request, determining whether the buffer is full.

Example 18b: The method of example 17b, comprising determining whether the buffer is empty if there is no memory request to the non-volatile memory, and removing an entry from the buffer if it is determined that the buffer is full.

Example 19b: A machine-readable storage media having machine-readable instructions that when executed cause one or more circuitries to perform a method according to any examples 1b to 16b.

Example 20b: A machine-readable storage media having machine-readable instructions that when executed cause one or more circuitries to perform a method according to any examples 17b to 18b.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A method comprising:
    determining whether there is a memory request to a memory, wherein the memory is a non-SRAM memory;
    upon determination that there is a memory request, determining whether a restore buffer is full, wherein the restore buffer has an address field and a data field;
    upon determination that there is a memory request, determining a type of memory request; and
    issuing a subsequent restore request if the memory request is a read request, wherein the read request is separate from the subsequent restore request.

2. The method of claim 1 comprising determining whether the restore buffer is empty if there is no memory request to the memory.

3. The method of claim 2 comprising removing an entry from the restore buffer if it is determined that the restore buffer is not empty.

4. The method of claim 1 comprising creating an entry in the restore buffer if the restore buffer is not full, wherein the entry is of a restore operation in waiting.

5. The method of claim 1 comprising looking up the restore buffer for an address of the memory request if the restore buffer is not full.

6. The method of claim 5 comprising determining a type of memory request if an address is found in the restore buffer that matches with the address of the memory request.

7. The method of claim 6 comprising reading data from the address in the restore buffer if the memory request is a read memory request.

8. The method of claim 6 comprising:
    invalidating an entry in the restore buffer associated with the address that matches with the address of the memory request if the memory request is a write request; and
    writing data to the memory.

9. The method of claim 8 comprising determining a type of memory request if an address is found in the restore buffer does not match with the address of the memory request.

10. The method of claim 9, comprising reading data from the memory using the address in the memory request.

11. The method of claim 10 comprising adding an entry in the restore buffer with data and address of the read data and the address in the memory request.

12. The method of claim 1, wherein the restore buffer comprises static random-access memory.

13. The method of claim 5 comprising writing data in the memory using the address of the memory request.

14. The method of claim 1, wherein the memory comprises one of a ferroelectric memory or a dynamic random-access memory.

15. The method of claim 14, wherein the ferroelectric memory comprises non-linear polar material which includes one of: ferroelectric material, paraelectric material, or non-linear dielectric.

16. The method of claim 15, wherein the ferroelectric material includes one of:
    Bismuth ferrite (BFO), BFO with a doping material where in the doping material is one of Lanthanum, or elements from lanthanide series of periodic table;
    Lead zirconium titanate (PZT), or PZT with a doping material, wherein the doping material is one of La or Nb;

relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST);

a perovskite which includes one of: BaTiO3, PbTiO3, KNbO3, or NaTaO3;

a hexagonal ferroelectric which includes one of: YMnO3 or LuFeO3;

hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);

Hafnium (Hf), Zirconium (Zr), Aluminum (Al), Silicon (Si), their oxides or their alloyed oxides;

Hafnium oxides as 1−x Ex Oy, where E can be Al, Ca, Ce, Dy, Er, Gd, Ge, La, Sc, Si, Sr, Sn, Zr, or Y;

Al(1−x)Sc(x)N, Ga(1−x)Sc(x)N, Al(1−x)Y(x)N or Al(1−x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction;

Niobate type compounds LiNbO3, LiTaO3, Lithium iron Tantalum Oxy Fluoride, Barium Strontium Niobate, Sodium Barium Niobate, or Potassium strontium niobate; or an improper ferroelectric which includes one of: [PTO/STO]n or [LAO/STO]n, where 'n' is between 1 to 100.

17. A method comprising:

storing a copy of data and its address into a buffer, wherein the copy corresponds to a data and address in a non-volatile memory, wherein the buffer comprises static random-access memory;

determining whether there is a memory request to the non-volatile memory; and upon determining that there is a memory request, determining whether the buffer is full.

18. The method of claim 17, comprising:

determining whether the buffer is empty if there is no memory request to the non-volatile memory, and removing an entry from the buffer if it is determined that the buffer is not empty.

19. A machine-readable storage media having machine-readable instructions that when executed cause one or more circuitries to perform a method comprising:

determining whether there is a memory request to a memory, wherein the memory is a non-SRAM memory;

upon determination that there is a memory request, determining whether a restore buffer is full, wherein the restore buffer has an address field and a data field;

upon determination that there is a memory request, determining a type of memory request; and issuing a subsequent restore request if the memory request is a read request, wherein the read request is separate from the subsequent restore request.

20. The machine-readable storage media of claim 19 having further machine-readable instructions that when executed cause the one or more circuitries to perform a further method comprising:

determining whether the restore buffer is empty if there is no memory request to the memory;

removing an entry from the restore buffer if it is determined that the restore buffer is not empty; and creating an entry in the restore buffer if the restore buffer is not full, wherein the entry is of a restore operation in waiting.

\* \* \* \* \*